United States Patent
Hanzawa et al.

(10) Patent No.: US 7,619,911 B2
(45) Date of Patent: Nov. 17, 2009

(54) SEMICONDUCTOR INTEGRATED CIRCUIT DEVICE

(75) Inventors: Satoru Hanzawa, Hachioji (JP); Junji Shigeta, Fuchu (JP); Shinichiro Kimura, Kunitachi (JP); Takeshi Sakata, Hino (JP); Riichiro Takemura, Tokyo (JP); Kazuhiko Kajigaya, Iruma (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/579,911

(22) PCT Filed: Nov. 21, 2003

(86) PCT No.: PCT/JP03/14901

§ 371 (c)(1),
(2), (4) Date: Apr. 9, 2007

(87) PCT Pub. No.: WO2005/050663

PCT Pub. Date: Jun. 2, 2005

(65) Prior Publication Data

US 2007/0274144 A1  Nov. 29, 2007

(51) Int. Cl.
*G11C 15/00* (2006.01)
(52) U.S. Cl. ............... 365/49.1; 365/49.12; 365/49.16; 365/49.18
(58) Field of Classification Search ................ 365/49.1, 365/49.12, 49.16, 49.18
See application file for complete search history.

(56) References Cited

U.S. PATENT DOCUMENTS

| | | | |
|---|---|---|---|
| 6,181,591 B1 | 1/2001 | Miyatake et al. | |
| 6,343,029 B1 | 1/2002 | Kengeri et al. | |
| 6,400,594 B2 * | 6/2002 | Hata et al. | 365/49.1 |
| 6,483,733 B2 | 11/2002 | Lines et al. | |
| 2002/0044475 A1 | 4/2002 | Lines et al. | |
| 2003/0058672 A1 * | 3/2003 | Aikawa | 365/49 |
| 2004/0184331 A1 | 9/2004 | Hanzawa et al. | |

FOREIGN PATENT DOCUMENTS

JP  2000-132978 A  5/2000

(Continued)

OTHER PUBLICATIONS

Johns et al., Analog Integrated Circuit Design, 1997, John Wiley & Sons, Inc., p. 94.*
Lines et al., 66MHz 2.3M Ternary Dynamic Content Addressable Memory, Records of the 2000 IEEE International Workshop on Memory Technology, Design and Testing, 2000, pp. 101-105.

*Primary Examiner*—Hoai V Ho
*Assistant Examiner*—Fernando N Hidalgo
(74) *Attorney, Agent, or Firm*—Miles & Stockbridge P.C.

(57) ABSTRACT

In a memory array structured of memory cells using a storage circuit STC and a comparator CP, either one electrode of a source electrode or a drain electrode of a transistor, whose gate electrode is connected to a search line, of a plurality of transistors structuring the comparator CP is connected to a match line HMLr precharged to a high voltage. Further, a match detector MDr is arranged on a match line LMLr precharged to a low voltage to discriminate a comparison signal voltage generated at the match line according to the comparison result of data. According to such memory array structure and operation, comparison operation can be performed at low power and at high speed while influence of search-line noise is avoided in a match line pair. Therefore, a low power content addressable memory which allows search operation at high speed can be realized.

3 Claims, 23 Drawing Sheets

FOREIGN PATENT DOCUMENTS

| | | |
|---|---|---|
| JP | 2001-319481 A | 11/2001 |
| JP | 2002-541610 A | 12/2002 |
| JP | 2003-100086 A | 4/2003 |
| JP | 2003-303495 A | 10/2003 |
| JP | 2004-128266 A | 4/2004 |
| WO | WO 03/065377 A1 | 8/2003 |

* cited by examiner

Prior Art

FIG. 26

| Search Key | | Entry | | | State of Current Path | | Comparison Result |
|---|---|---|---|---|---|---|---|
| Data | SL2 | SL1 | Data | N1 | N2 | M1 Side | M2 Side | |
| '0' | 1 | 0 | '1' | 1 | 0 | Conductive | Cut Off | Unmatched |
| '1' | 0 | 1 | '1' | 1 | 0 | Cut Off | Cut Off | Matched |
| '0' | 1 | 0 | '0' | 0 | 1 | Cut Off | Cut Off | Matched |
| '1' | 0 | 1 | '0' | 0 | 1 | Cut Off | Conductive | Unmatched |
| '0' | 1 | 0 | 'X' | 0 | 0 | Cut Off | Cut Off | Matched |
| '1' | 0 | 1 | 'X' | 0 | 0 | Cut Off | Cut Off | Matched |
| 'X' | 0 | 0 | '1' | 1 | 0 | Cut Off | Cut Off | Matched |
| 'X' | 0 | 0 | '0' | 0 | 1 | Cut Off | Cut Off | Matched |
| 'X' | 0 | 0 | 'X' | 0 | 0 | Cut Off | Cut Off | Matched |

SEMICONDUCTOR INTEGRATED CIRCUIT DEVICE

TECHNICAL FIELD

The present invention relates to a semiconductor integrated circuit device including a content addressable memory cell (CAM cell) which performs comparison between data stored at a storage node and inputted data, and in particular to an effective technique applied to a technique for integrating a ternary dynamic CAM cell (TDCAM cell) for storing ternary data, while performing refresh operation, in high density to realize a high-speed TDCAM array with low power consumption.

BACKGROUND ART

A TDCAM cell structure in a ternary dynamic content addressable memory (TDCAM) is described in, for example, 'Records of the 2000 IEEE International Workshop on Memory Technology, Design and Testing, 2000, Page(s): 101-105' (hereinafter, called "Literature 1").

One example of a cell structure shown in FIG. 2 in Literature 1 is shown in FIG. 21.

The cell is formed utilizing an Embedded DRAM (dynamic random access memory) processing technique, and it has a memory function storing ternary data utilizing NMOS (N-channel metal oxide semiconductor) transistors T1 and T2, and capacitors C1 and C2.

Further, the cell has an XNOR (Exclusive NOR) operation function configured of NMOS transistors T3, T4, T5, T6, and it performs comparison between stored data (entry) and inputted data. Incidentally, a VPLT is a so-called "plate electrode voltage" inputted one of electrodes of the capacitors C1, C2.

The memory function will be first explained.

The ternary data is data '1' state, data '0' state, and data 'X' representing so-called 'Don't care' state. When high voltage is defined as logic '1' and low voltage is defined as logic '0', a logical value of the storage node (N1, N2) is (1, 0) in case of the data '1', it is (0, 1) in case of data '0', and it is (0,0) in case of data 'X'.

Refresh operation of stored data is performed through the transistors T1, T2. Though omitted in FIG. 21, read and rewrite operations are performed using sense amplifiers respectively connected to bit lines BL1, BL2.

The XNOR operation function will be then explained.

Data compared with stored data in search operation is ternary data inputted via search lines SL1, SL2. Breakdown of the ternary data includes data '1', data '0' and data 'X' representing a so-called 'MASK' state.

When the entry and the inputted data are the same, namely, when they match with each other, since connection of a match line ML precharged to a high voltage and a discharge line DCL fixed to a low voltage (for example, a ground potential VSS) is cut off, the match line is held at the precharged voltage.

Further, when the stored data is the "Don't care' state or the inputted data is the MASK' state, connection of the match line ML and the discharge line DCL is cut off, so that the match line is held at the precharge voltage like the match case.

Furthermore, when both the data are different from each other, namely, when both the data do not match with each other, since a current path is formed by making one of the stacked transistors T3, T4 or the stacked transistors T5, T6 conductive, the match line ML and the discharge line DCL short-circuit so that the match line ML is discharged toward the ground potential VSS.

The comparison result is determined by discriminating voltage change of the match line ML due to the above operation using a match line sense amplifier (not shown).

FIG. 26 is a truth table collectively representing the above search operations.

U.S. Pat. No. 6,343,029 (hereinafter, called 'Literature 2') describes another example of the CAM cell structure. A main portion of a cell structure and an array structure shown in FIG. 1 in Literature 2 is shown in FIG. 22. In FIG. 22, transistors acting in the same manner as those in FIG. 21 are allocated with same symbols in order to assist understanding.

The cell is for comparing data held in storage circuits CST1, CST2 with data inputted via search lines SL1 and SL2 in a comparator CCP, and it has two features described below.

A first feature lies in that a signal corresponding to comparison result is generated according to charge-sharing operation using a match line ML and a common source-line CSL arranged in parallel.

A second feature lies in that connecting lines of transistors constituting the comparator CCP is different from those in the cell shown in FIG. 21. That is, the transistor T4 connected to the storage node N1 is connected to the match line ML and the transistor T3 connected to the search line SL2 is connected to a common source-line CSL, respectively.

Similarly, the transistor T6 connected to the storage node N2 is connected to the match line ML, and the transistor T5 connected to the search line SL1 is connected to the common source-line CSL, respectively. Incidentally, the comparator CCP can performs XNOR operation similar to that in the cell shown in FIG. 21 even if connections in the cell are different.

Next, the charge-sharing operation in the search operation will be explained.

In a standby state, first, the match line ML is precharged to a high voltage VPCH and the common source-line CSL is precharged to the ground potential VSS respectively by making a PMOS (P-channel MOS) transistor THP and an NMOS transistor TL conductive.

When a search operation starts, first, the transistors THP and TL are put in a cut-off state and the match line ML and the common source-line CSL are put in a floating state by driving precharge enable signals PREB and PRE.

Next, search key is inputted via the search lines SL1 and SL2. Here, when the entry and the search key are the same, since connection of the match line ML and the common source-line CSL is cut off, the match line ML is held at the precharge voltage VPCH.

On the other hand, when the entry and the search key are different from each other, a current path is formed in the comparator CCP like the cell shown in FIG. 21, so that the match line ML and the common source-line CSL are caused to short-circuit. Therefore, charge stored in a parasitic capacitance CM of the match line ML is divided to the parasitic capacitance CM and a parasitic capacitance CC of the common source-line CSL, so that a voltage of the match line ML lowers.

Finally, the comparison result of data is determined by discriminating voltage change of the match line ML. In such an operation, when the parasitic capacitance CM and the parasitic capacitance CC are the same, a voltage of the match line ML after short-circuiting becomes an intermediate voltage VPCH/2 between the precharge voltage VPCH and the ground potential VSS.

In the structure shown in FIG. 22, therefore, since a voltage amplitude in the match line is small as compared with a case that the common source-line CSL is connected to the ground potential VSS like the structure shown in FIG. 21, power required for match line precharging is suppressed.

The CAM described in the above Literatures is a device which compares a plurality of stored data (hereinafter, called "entry") and comparison data (hereinafter, called "search key") with each other simultaneously, to determine whether or not the former and the latter are equal to each other or different from each other.

Therefore, a demand in communication equipment application such as a router or a switch where high speed in table search is required increases. However, table scale rapidly increases according to recent explosive growth of Internet, which is problematic regarding advance in large capacity of the TCAM.

As the result obtained when the inventors of the present invention examined the large capacity of the TCAM prior to making the present invention, the inventors has found out that consideration about advance in high integration and advance in low power consumption has not been made sufficiently in the memory cell structure shown in FIG. 21 and FIG. 22.

Regarding the first advance in high integration, it is effective to make a capacitor three-dimensional and introduce a commodity DRAM fabricating technique using a self-aligned process in order to further reduce a memory cell area.

However, since the memory cell shown in FIG. 21 includes a large number of elements and a large number of signals, there is a possibility that it is difficult to realize a layout and a structure of a regular memory array such as the commodity DRAM and it is difficult to introduce the self-aligned process.

Further, as seen in the storage nodes N1 and N2, since a structure for connecting the gate electrode and the source or drain electrode of the transistor, which is not included in the commodity DRAM, is required in the memory cell, matching with manufacturing steps for the commodity DRAM can not be achieved, which may require development of a new manufacturing technique.

Regarding the second advance in low power consumption, the charge-sharing operation based upon the structure shown in FIG. 22 is effective for suppressing precharge power in the match line. In a structure of the comparator CCP shown in FIG. 22, however, influence of noises due to a coupling capacitance between wires which may be problematic in a commodity DRAM using extremely fine machining becomes large, which may result in increase in time required for comparison operation.

FIG. 23 shows a main portion of a cell structure and an array structure of CAM examined in detail prior to making the present invention about this problem.

FIG. 23 is an equivalent circuit model obtained by considering a coupling capacitance in the memory cell CMC shown in FIG. 22, where coupling capacitances CSC1, CSC2 are inserted between the search lines SL1, SL2 and the common source-line CSL, and coupling capacitances CNMC1, CNMC2 are inserted between the storage nodes N1, N2 and the match line ML.

FIG. 24 and FIG. 25 show one example of a search operation timing in the structure shown in FIG. 23. Here, it is assumed that the memory cell CMC reserves the entry '1' using the storage circuits CST1, CST2.

In this case, a logical value of the storage node is (N1, N2)=(1, 0), and the storage node N1 is held at the external power supply VDD, while the storage node N2 is held at the ground potential VSS. Accordingly, the transistor T4 is made conductive, while the transistor T6 is in a cut-off state.

Further, the reference voltage VR is a reference voltage for discriminating a voltage on the match line. Furthermore, the VSIGC is a voltage difference between a match line voltage required for accurate discrimination and the reference voltage VR, and it is hereinafter called "comparison signal voltage".

In the beginning, search operation timing when the held data and the input data match with each other will be explained with reference to FIG. 24.

First, in a standby state, by driving a precharge enable signal PREB and a precharge enable signal PRE to the ground potential VSS and the external power supply VDD respectively, the transistors THP, TL are respectively made conductive to drive the match line ML and the common source-line CSL to the precharge voltage VPCH and the ground potential VSS respectively.

When the search operation starts, by driving the precharge enable signal PREB put in the ground potential VSS and the precharge enable signal PRE put in the external power supply to the ground potential VSS, respectively, each of the transistors THP, TL are put in an OFF state, and the match line ML and the common source-line CSL are put in a floating state.

Subsequently, search key is inputted through the search line. When the data of the search key compared with the stored data in the memory cell CMC is '1', since the logical value of the search line is (SL1, SL2)=(1,0), the search line SL1 put in the ground potential VSS is driven to the external power supply VDD and the search line SL2 is held at the ground potential VSS.

Here, since the search line SL1 is coupled to the common source-line CSL via the parasitic capacitance CSC1, a voltage of the common source-line CSL rises according to activation of the search line SL1. Such a voltage rising due to fluctuation of the search line voltage is hereinafter called "search-line noise".

Incidentally, though omitted in FIG. 23, since actual search key is data constituted of a plurality of bits, and a plurality of memory cells is connected to one match line, so that search-line noises are superimposed when a plurality of search lines are simultaneously driven.

Further, when data 'X' is inputted at the TCAM, a corresponding search line pair is held at the ground potential VSS. Accordingly, the capacitance of the search-line noise VNC shown in FIG. 24 becomes a value corresponding to a data pattern of the search key, namely, the number of search lines to be driven.

On the other hand, though the match line ML is connected to the storage nodes N1, N2 via the coupling capacitances CNMC1, CNMC2, respectively, voltages of the storage nodes are held, so that the match line ML is held at the precharge voltage VPCH.

Now, the transistor T5 in the memory cell CMC11 is made conductive by inputting of the search key, but no current flows on the side of the storage node N2 in the comparator CP because the transistor T6 is in the cut-off state.

Further, since the transistor T3 is in the cut-off state, no current also flows to the storage node N1. That is, the comparator CP in the memory cell CMC11 is in a matched state.

Accordingly, since the match line ML is held at the precharge voltage VPCH, match determination is made by detecting that a positive comparison signal VSIGC relative to the reference voltage VR is generated in the match line ML utilizing any method.

Next, a search operation when the search key and the entry are different from each other will be explained with reference to FIG. 25. An operation for making the match line ML and the common source-line CSL in a floating state and then inputting the search key is as describe above.

A search operation when the entry in the memory cell CMC and data to be compared are '0' will be described below.

In this case, since the logical value in the search line is (SL1, SL2)=(0, 1), the search line SL1 is held at the ground potential VSS, while the search line SL2 put in the ground potential VSS is driven to the external power supply VDD.

Here, since the search line SL2 is coupled to the common source-line CSL via the parasitic capacitance CSC2, the voltage on the common source-line CSL rises according to activation of the search line SL2 like the case shown in FIG. 24.

Now, when the search key is inputted, the transistor T3 in the memory cell MC11 is made conductive, so that a current path is formed on the side of the storage node N1 in the comparator CCP and thereby the match line ML and the common source-line are short-circuited to each other.

That is, the match line ML driven to the precharge voltage VPCH is discharged toward an intermediate voltage VM and the common source-line CSL precharged to the ground potential VSS is charged toward the intermediate voltage VM.

Therefore, it is determined that the comparison result shows unmatch by discriminating that the voltage in the match line ML has been below the reference voltage VR and a negative comparison signal voltage—VSIGC relative to the reference voltage has been generated utilizing any method. Finally, by driving the search line SL2 put in the external power supply VDD to the ground potential VSS and driving the precharge enable signal PREB put in the external power supply VDD and the precharge enable signal PRE put in the ground potential VSS to the ground potential VSS and the external power supply VDD, respectively, to precharge the match line ML and the common source-line CSL respectively, the search operation is terminated.

Incidentally, t1 indicates a time elapsing from driving of the search line to generation of the negative comparison signal voltage—VSIGC, and it is hereinafter called "search time". In FIG. 25, a match line waveform where other memory cells connected to the match line ML are put in a matched state is shown for explaining an operation timing under the worst conditions.

However, when other memory cells are in an unmatched state, since the match line and the common source-line CSL are short-circuited by current path formed in a plurality of memory cells, it is apparent that they are changed to the intermediate voltage VM faster than the waveform shown in FIG. 25.

Further, when the coupling capacitances CSC1, CSC2, CNMC1, CNMC2 are the same value, and load capacitances of the match line ML and the common source-line CSL are equal to each other, a voltage after the short-circuit becomes VPCH/2. However, it will be understood easily that the voltage after the short-circuit becomes a voltage VM higher than VPCH/2 according to the capacitance of the search-line noise.

From the above search operation, since a voltage at the source electrode (here, the common source-line CSL) rises due to the search-line noise so that the gate-source voltage becomes small and a threshold voltage further rises due to a substrate bias effect, a driving ability in the transistor T3, T5 in the memory cell CMC shown in FIG. 23 lowers.

Therefore, in the TCAM according to the structure shown in FIG. 23, a precharging power on the match line can be suppressed, but there is such a possibility that the search time t1 significantly increases due to the data pattern of the search key, which results in slowdown of the search operation.

An object of the present invention is to provide a layout of a memory cell and an internal node connection technique for applying a commodity DRAM fabricating technique for advance in high integration of a TDCAM cell.

Another object of the present invention is to provide a technique for avoiding increase in a search time due to search-line noise in a charge-sharing system effective for advance in power consumption reduction in a match line.

The aforesaid and other objects, and a novel feature of the present invention will be apparent from the description in the text and the accompanying drawings.

DISCLOSURE OF THE INVENTION

The following is a brief description of outlines of representative ones of the inventions disclosed in the present application.

(1) The present invention is a semiconductor integrated circuit device comprising a plurality of match line pairs, a plurality of search line pairs crossing the plurality of match line pairs, and a plurality of memory cells arranged at crossing points of the plurality of match line pairs and the plurality of search line pairs, wherein each of the plurality of match line pairs have a precharge circuit, the plurality of precharge circuits drive first match lines and second match lines in the match line pairs to a first voltage and a second voltage lower than the first voltage, respectively, the plurality of memory cells have storage circuits and comparators, the comparators have first and second MOS transistors, gate electrodes of the first and second MOS transistors are respectively connected to the plurality of search lines and either of source or drain electrodes of the first and second MOS transistors are connected to the plurality of first match lines, respectively.

Further, outlines of other inventions in the present application will be described briefly.

(2) The present invention is a semiconductor integrated circuit device comprising a plurality of match line pairs, a plurality of search line pairs crossing the plurality of match line pairs, and a plurality of memory cells arranged at crossing points of the plurality of match line pairs and the plurality of search line pairs, wherein each of the plurality of match line pairs has a precharge circuit, the plurality of precharge circuits drive first match lines and second match lines in the match line pairs to a first voltage and a second voltage lower than the first voltage, each of the plurality of memory cells has a storage circuit and a comparator, the comparator has first and second MOS transistors connected serially so as to form a first current path between the plurality of match line pairs and third and fourth MOS transistors connected serially so as to form a second current path, the gate electrodes of the first and third MOS transistors are connected to the plurality of search lines, respectively, one electrodes of the source electrodes and the drain electrodes of the first and third MOS transistors are connected to a plurality of first match lines via contacts formed according to a self-aligned process, respectively, the gate electrodes of the second and fourth MOS transistors are connected to the storage circuits, respectively, and one electrodes of the source electrodes and the drain electrodes of the second and fourth MOS transistors are connected to a plurality of second match lines via contacts formed according to a self-aligned process, respectively.

(3) The present invention is a semiconductor integrated circuit device comprising a plurality of first match lines, a plurality of search line pairs crossing the plurality of first match lines, a plurality of bit line pairs parallel to the plurality of search line pairs, and a plurality of memory cells arranged at crossing points of the plurality of first match lines and the plurality of search line pairs, wherein each of the plurality of memory cells has a storage circuit and a comparator, the storage circuit is connected to the plurality of bit line pairs, the comparator is connected to a plurality of search line pairs and a plurality of first match lines, a voltage amplitude in the plurality of bit line pairs is larger than that in the plurality of search line pairs.

BRIEF DESCRIPTION OF THE DRAWINGS

FIG. 26 is an explanatory diagram showing a truth table of a search operation in the memory cell shown in FIG. 21.

BEST MODE FOR CARRYING OUT THE INVENTION

Figure 1:
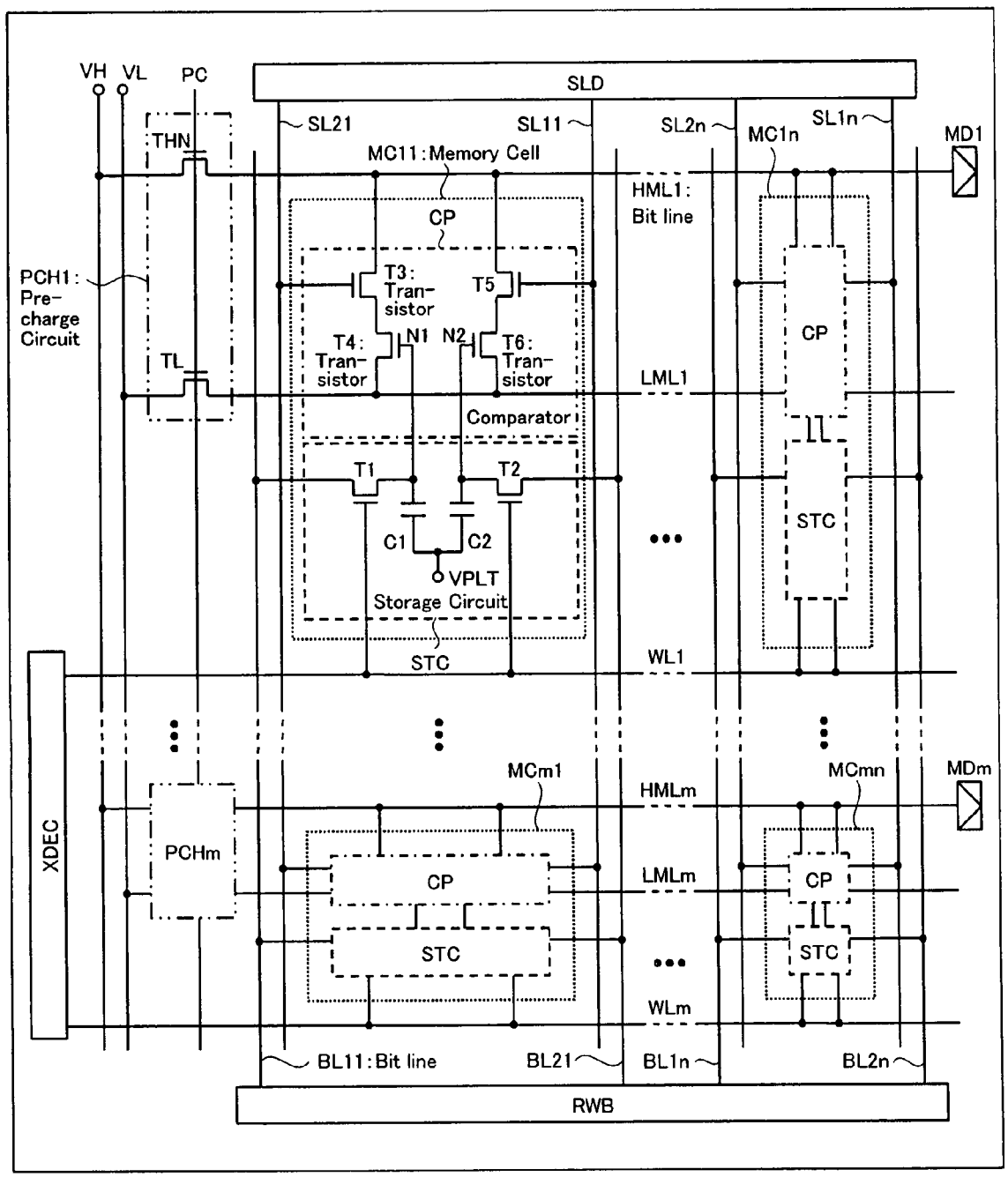
FIG. 1 is a diagram showing another constituent example of a memory array using a memory cell configured of six transistors and two capacitors according to a first embodiment of the present invention.

For explaining the present invention in detail, explanation is made with reference to the accompanying drawings. Incidentally, parts having same function are attached with same reference numerals throughout all the figures for explaining embodiments, and repetitive explanation thereof will be omitted. A circuit element constituting each block in embodiments is not limited but can be typically formed on one piece of semiconductor substrate such as a single crystal silicon by a semiconductor integrated circuit technique for a known CMOS (complementary MOS transistor), a three-dimensional capacitor, or the like.

FIRST EMBODIMENT

In a first embodiment, FIG. 1 shows a constituent example of a memory array. In FIG. 1, a row decoder XDEC, a read-write circuit block RWB, a search-line driver SLD, a precharge circuit PCHr (r=1, 2, . . . , m), a match detector MDr (r=1, 2, . . . , m) which are required for operations of the memory array are also shown simultaneously.

The structure has the following two features.

The first feature lies in a point that precharge circuits PCHr (r=1, 2, . . . , m) for driving one of two match lines to a high voltage (a first voltage) and driving the other to a low voltage (a second voltage), respectively, are arranged and match detectors MDr (r=1, 2, . . . , m) are disposed in the match line driven to the high voltage.

The second feature lies in a point that a search line and the match line to be driven to the high voltage are connected to each other through a parasitic capacitor described later.

In such a structure, comparison signal voltages are generated on the two match lines according to a charge-sharing operation, and the signal generated on the match line at the high voltage side is discriminated by the match detector.

In the following explanation, a match line (a first match line) HMLr (r=1, 2, . . . , m) driven to the high voltage and a match line (a second match line) LMLr (r=1, 2, . . . , m) driven to the low voltage are called "high voltage side match line" and "low voltage side match line", respectively. Further, two match lines corresponding to each other are called "match line pair", if necessary.

In FIG. 1, a plurality of bit lines BL1s (s=1, 2, . . . , n) and bit lines BL2s (s=1, 2, . . . , n) are alternately arranged in parallel and two bit lines corresponding to each other are connected to one memory cell.

A plurality of search lines SL1s (s=1, 2, ..., n) and search lines SL2s (s=1, 2, ..., n) are arranged in parallel to corresponding bit lines. In the following, two bit lines corresponding to each other such as, for example, a bit line BL11 and a bit line BL21 are called "bit line pair", if necessary.

Similarly, two search lines corresponding to each other such as a search line SL11 and a search line SL21 are called "search line pair", if necessary. In FIG. 1, a plurality of word lines WLr (r=1, 2, ..., m) are arranged so as to cross the bit line pair, and a plurality of high voltage side match lines HMLr (r=1, 2, ..., m) and a plurality of low voltage side match lines LMLr (r=1, 2, ... m) are arranged in parallel to corresponding word lines. Here, two match lines corresponding to each other such as a match line HML1 and LML1 are called "match line pair" in the following, if necessary. Memory cells MCrs (r=1, 2, ..., m, s=1, 2, ..., n) are disposed at respective crossing points of the bit line pairs and the word line pairs, respectively.

Figure 21:
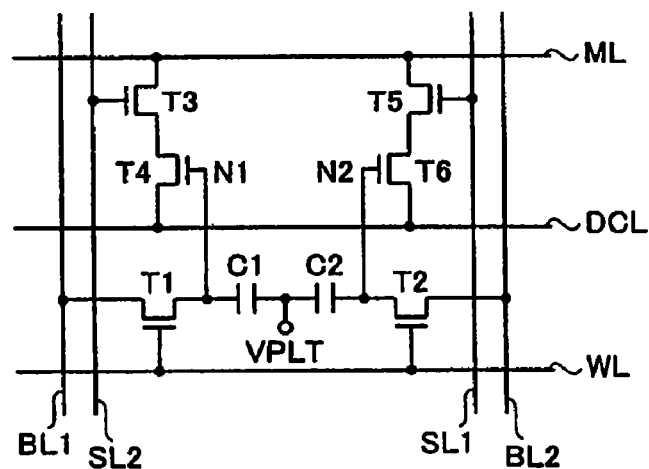
FIG. 21 is a diagram showing a conventional example of a ternary dynamic content addressable memory cell configured of six transistors and two capacitors.

The memory cell has a TDCAM cell structure including two capacitors and six transistors like the structure shown in FIG. 21. However, the memory cell is different from the memory cell shown in FIG. 21 in that the sources of the transistors T4, T6 connected to the discharge line DCL shown in FIG. 21 are connected to the low voltage side match line LML. In FIG. 1, an element configuring the memory cell MC is shown in two circuits divided corresponding to functions for comparison with the structure of the memory cell CMC shown in FIG. 22.

That is, the transistors T1, T2 and the capacitors C1, C2 constitute a storage circuit STC, and the transistor (first transistor) T3, the transistor (third transistor) T4, the transistor (second transistor) T5, and the transistor (fourth transistor) T6 constitute a comparator CP, respectively.

Figure 22:
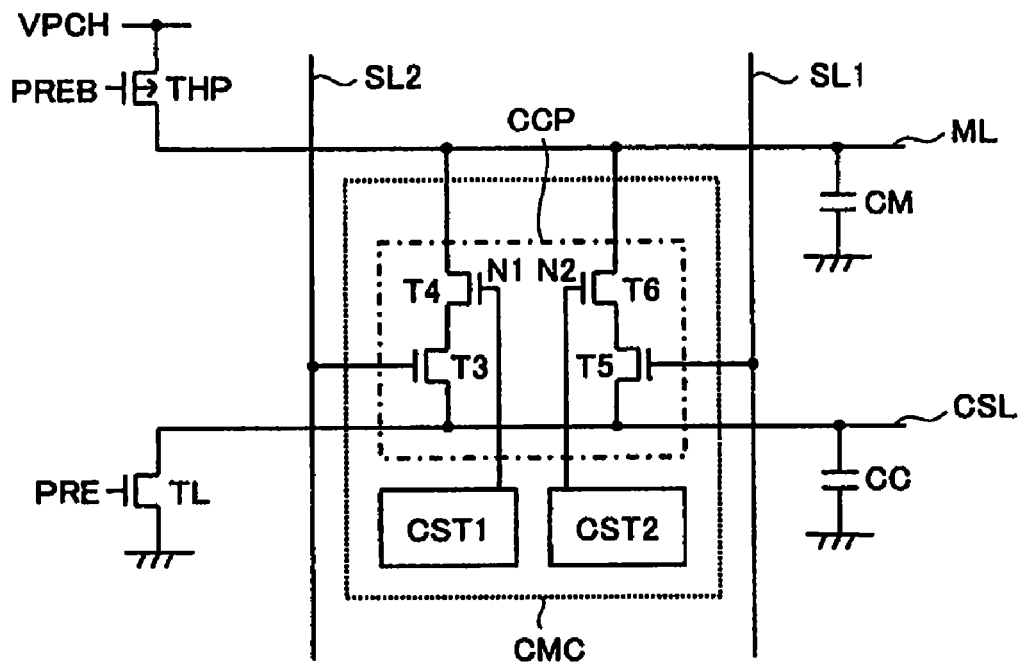
FIG. 22 is a diagram showing a conventional example of a content addressable memory cell according to a comparison signal voltage generating method using a charge-sharing operation and a memory array.
Figure 23:
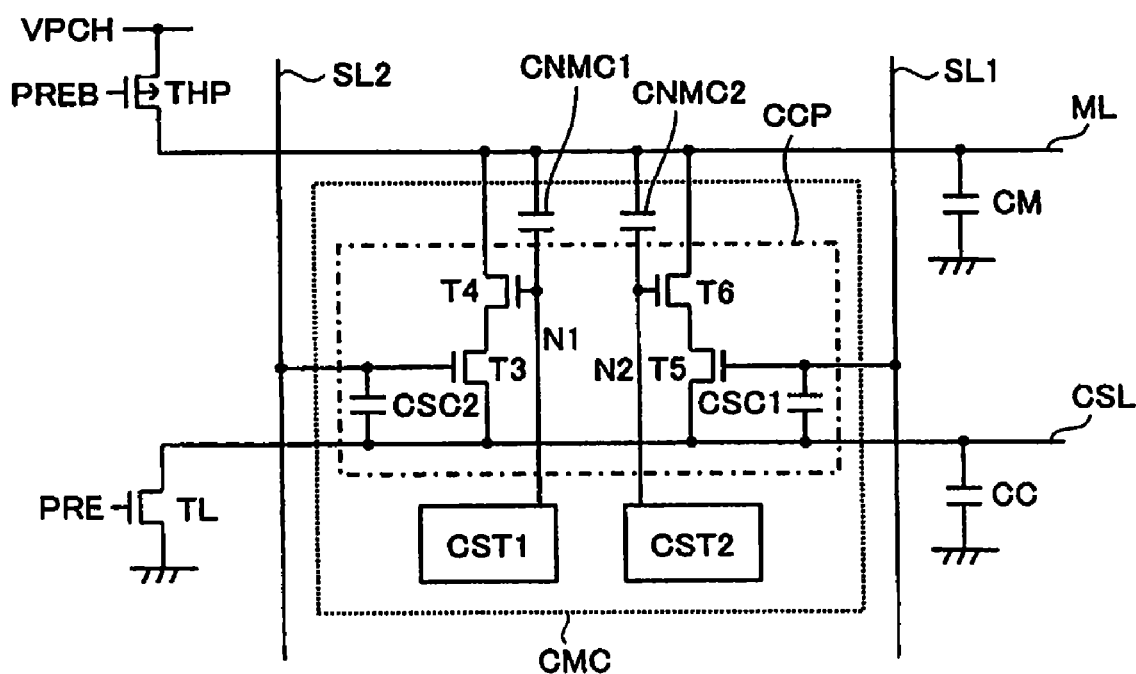
FIG. 23 is a diagram showing one example of an equivalent circuit obtained by considering a coupling capacitance between wires in the memory cell shown in FIG. 22.
Figure 24:
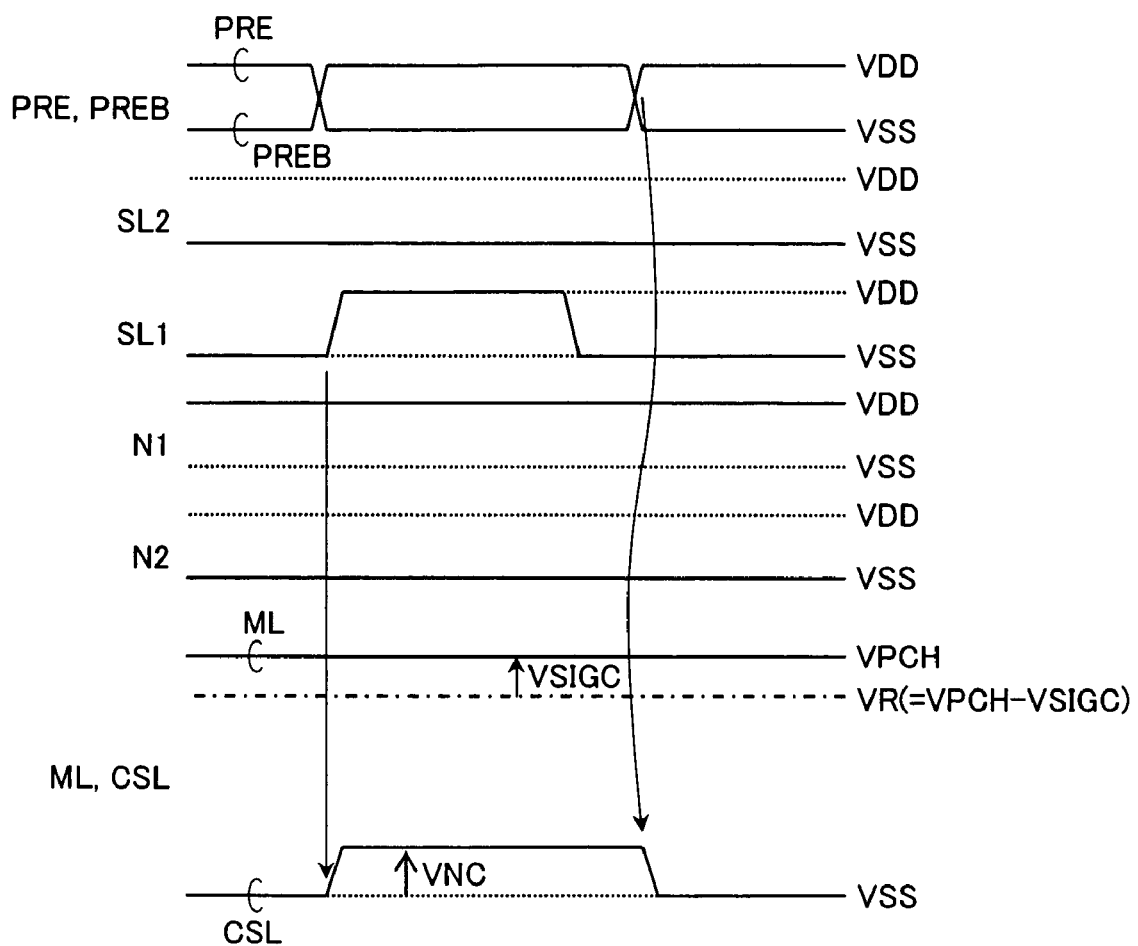
FIG. 24 is a diagram showing one example of a search operation timing when a match entry has been detected in the memory cell shown in FIG. 23.
Figure 25:
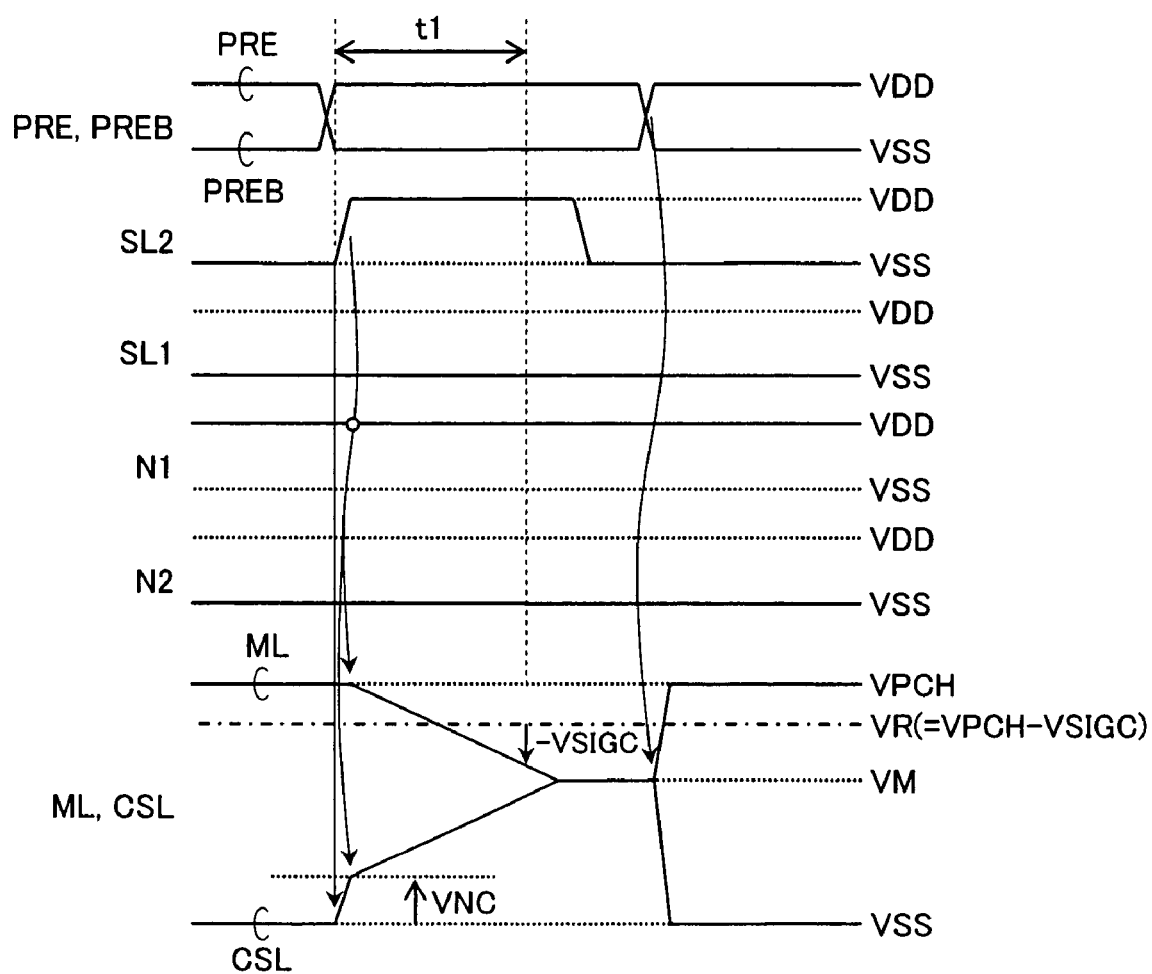
FIG. 25 is a diagram showing one example of a search operation timing when an unmatch entry has been detected in the memory cell shown in FIG. 23.

Accordingly, in comparison with the comparator CCP shown in FIG. 22, connection orders of the transistors to the precharge voltages on the match lines are-reversed in the comparator CCP, where the transistors T3 and T4 are connected in this order on one of the connection orders and the transistors T5 and T6 are connected in this order on the other from the high voltage match line HML to the low voltage match line LML.

The row decoder XDEC, the read-write circuit block RWB, the search-line driver SLD, the precharge circuit PCHr (r=1, 2, ..., m), and the match detector MDr (r=1, 2, ..., m) arranged around the memory array are selectively used according to an operation.

The row decoder XDEC and the read-write circuit block RWB is a circuit block used for read operation or write operation of stored data (entry, here) or refresh operation. The former row decoder XDEC selects a word line corresponding to a row address from the word lines WLr (r=1, 2, ..., m). The latter read-write circuit block RWB is structured of a plurality of sense amplifiers and precharge circuits arranged on respective bit lines BL1s (s=1, 2, ..., n), BL2s (s=1, 2, ..., n).

The sense amplifier has, for example, a known cross-couple-type latch structure, and it performs discrimination or amplification of a signal read on a bit line and further drives a bit line and a storage node to a voltage corresponding to write data.

The search-line driver SLD, the precharge circuits PCHr (r=1, 2, ..., m), and the match detectors MDr (r=1, 2, ..., m) are circuit used for search operation.

First, the search-line driver SLD drives the search lines SL1s (s=1, 2, ..., n), SL2s (s=1, 2, ..., n) to a voltage corresponding to input data (search key, here).

Next, the precharge circuits PCHr (r=1, 2, ..., m) are each constituted of NMOS transistors-THN, TL whose gate electrodes are connected with a precharge enable signal PC.

The transistor THN connects a power supply terminal of the precharge voltage VH and the high voltage side match line to each other and the transistor TL connects the power supply terminal of the precharge voltage VL and the low voltage side match line LML to each other, according to the precharge enable signal PC.

Here, the former precharge voltage VH is set to be higher than the latter precharge voltage VL. Incidentally, a PMOS transistor THP such as shown in FIG. 22 can be used instead of the transistor THN. However, since a complementary precharge actuation signal is required, power consumption is increased due to addition of a control signal. Further, since well separation is required, such a problem arises that a chip area becomes large.

Accordingly, it is desirable to adopt a constitution of the precharge circuit shown in FIG. 1 which can be constituted of only NMOS transistors and where the number of control signals is reduced. Further, the match detectors MDr (r=1, 2, ..., m) discriminate comparison signal voltages generated on the high voltage side match lines HMLr (r=1, 2, ..., m) according to the comparison result between the search key and the entry to determine whether or not the search key is matched with the entry.

With such a constitution, the following two effects are obtained.

The first effect is reduction in power consumption. In this memory array, as described later, by inputting search key to the search line pair after putting the match line pairs where respective match lines have been precharged to different voltages in a floating state, a signal corresponding to the comparison result of data is generated at the high voltage side match line according to charge-sharing operation. Accordingly, a voltage amplitude on the high voltage side match line can be suppressed to about half of the precharge voltage difference of the match line pair, so that power required for precharge operation to the match lines can be reduced.

The second effect is suppression of the comparison signal occurrence time. As described later, since the search line pair is coupled to the high voltage match line, search-line noise in the search operation is generated at the high voltage match line. Therefore, the transistors T3, T4, T5, and T6 in the memory cell can avoid lowering of driving ability due to lowering of the gate-source voltage or rising of the threshold voltage caused by the substrate bias effect, so that the search time can be shortened. A TCAM which performs search operation with low power and at high speed can be realized owing to the above two effects.

Next, an example of the layout of the memory array will be explained with reference to FIG. 2 and FIG. 3. The layout has four features as described below.

The first feature lies in arrangement of the gate electrode. First, the feature lies in that the gate electrode of the transistor connected to the storage node is formed in an L shape and a poly-silicon layer is arranged at the minimum spacing together with the word lines.

The second feature lies in that a diffusion area and a gate electrode of the transistor in the storage node are connected via a first metal layer corresponding to a wiring layer used for bit line formation for a commodity DRAM.

The third feature lies in that a memory cell and an adjacent memory cell share contacts and through-holes used for connection with bit lines, search lines and match lines. The fourth feature lies in that electrodes of four transistors constituting the comparator are respectively arranged in parallel.

Figure 2:
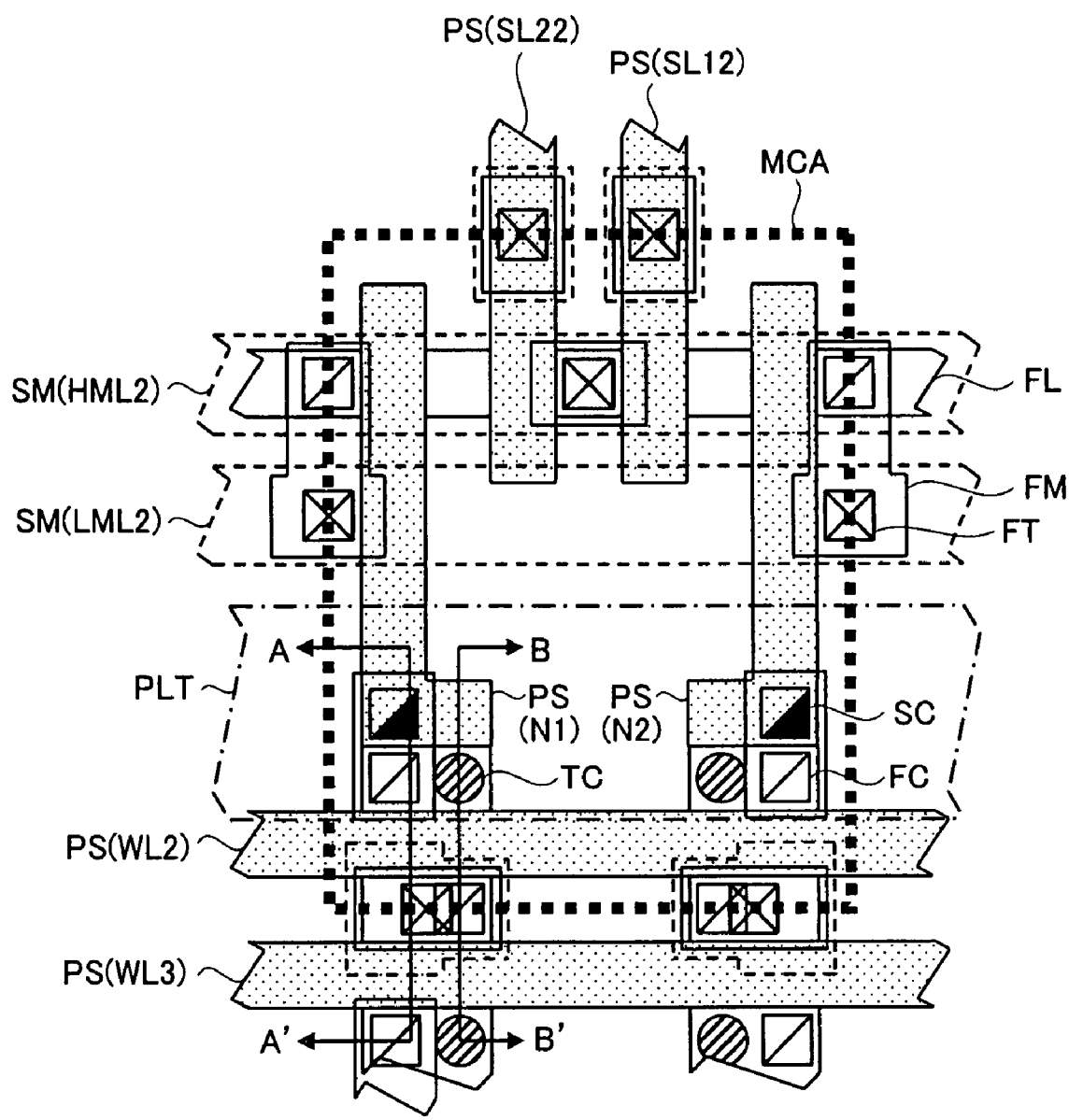
FIG. 2 is a view showing a layout of layers in the memory array positioned below a second metal layer in FIG. 1.

FIG. 2 shows a layout of layers positioned below a second metal layer regarding one portion of the memory array. A rectangular MCA drawn by thick dot line shows an area of one memory cell, which is not an actual layout pattern.

Only a boundary portion of adjacent memory cells is shown, but adjacent memory cells are in fact arranged in line symmetry respectively regarding respective sides of the rectangular MCA.

As illustrated, the memory cell is constituted of a pattern of active area FL, a pattern of poly-silicon PS serving as a gate electrode and a word line of a transistor formed on a silicon substrate, a pattern of plate-metal layer PLT for forming an upper electrode of a capacitor, a pattern of first metal layer FM used for connection between elements in the memory cell or connection between a contact and a through hole described later, a pattern of second metal layer SM for forming a high voltage side match line or a low voltage side match line, a pattern of first contact FC for connecting the active area and the first metal layer, a pattern of second contact SC for connecting the poly-silicon layer and the first metal layer, a pattern of third contact TC for connecting the active area and a lower electrode of the capacitor, a pattern of first through-hole FT for connecting the first metal layer and the second metal layer, and the like.

For patterning of these patterns, a well-known optical lithography can be used. Incidentally, in FIG. 2, a pattern of poly-silicon for forming the lower electrode of the capacitor is omitted for simplification, but it will be easily understood that the pattern of poly-silicon is disposed just below the pattern of plate-metal layer for each pattern of third contact from a known commodity DRAM processing technique.

Further, between parentheses subsequent to a pattern name, a corresponding node name is shown. Since a memory cell is disposed at an intersecting point of the match line HML2, LML2 and the search line SL12, SL22, it is easily understood that an area surrounded by the rectangular MCA is a memory cell MC22 positioned at the second row and the second column in the memory array shown in FIG. 1.

Figure 3:
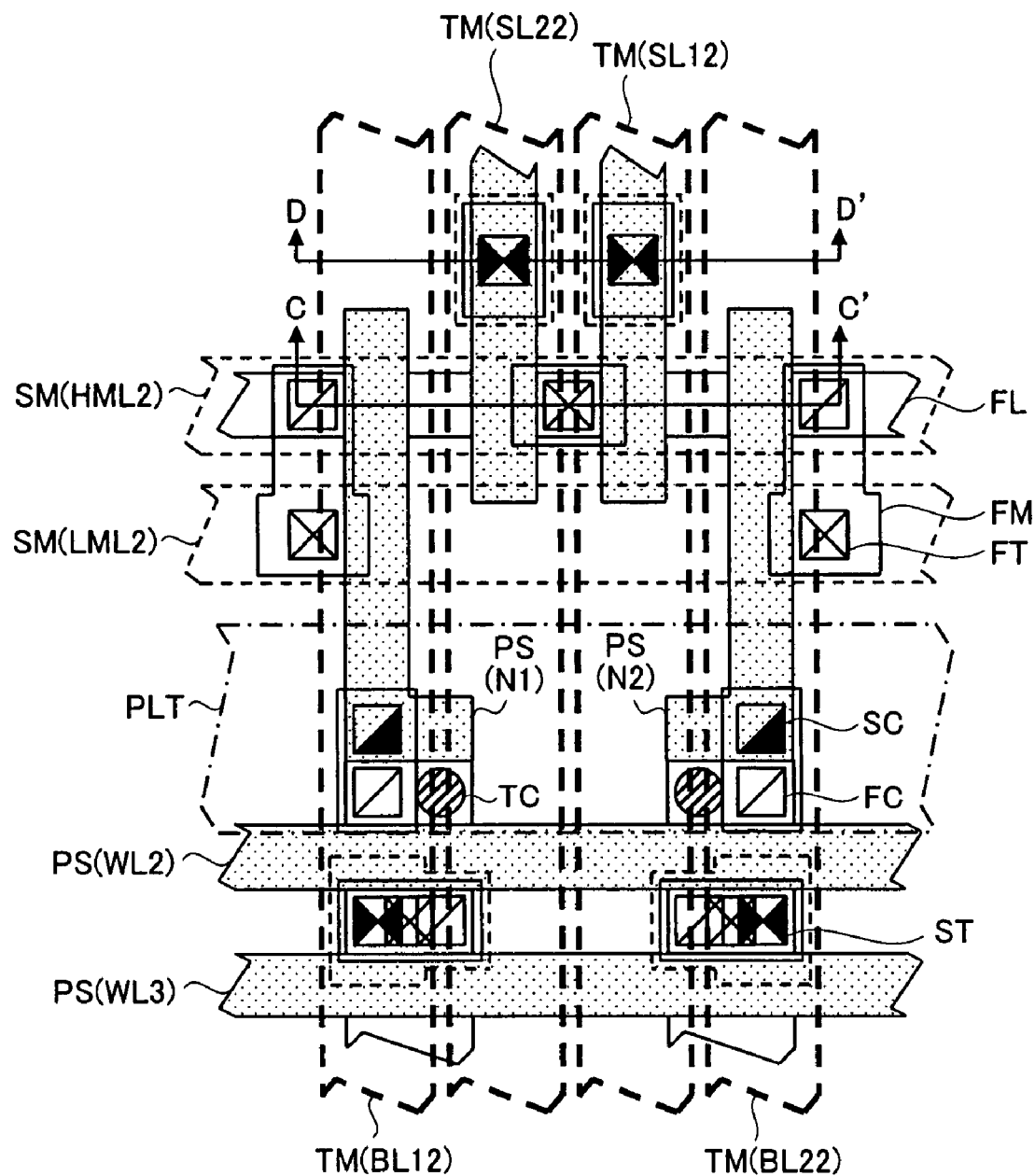
FIG. 3 is a view showing a layout of layers in the memory array positioned below a third metal layer in FIG. 1.

FIG. 3 is a diagram of a layout obtained by adding a pattern of layer above the second metal layer to FIG. 2.

In FIG. 3, the pattern of third metal layer TM is used for forming a bit line and a search line. The pattern of second through-hole ST connects the second metal layer and the third metal layer. Incidentally, it is widely known that the bit lines are formed using the first metal layer FM in a commodity DRAM. However, since there are many wires in the memory cells shown in FIG. 3, rising to the third metal layer TM which is a further upper layer is performed.

Figure 4:
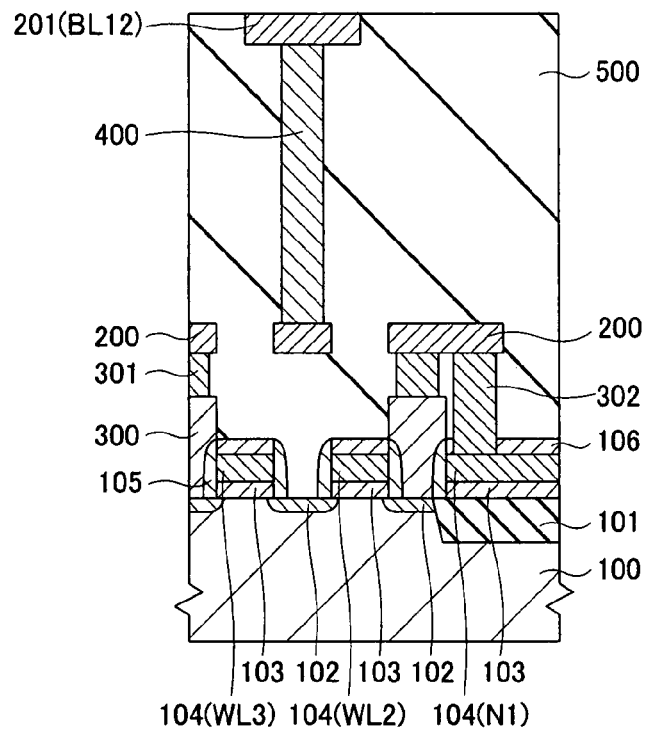
FIG. 4 is a sectional view showing a structure of a portion of the memory array taken along line A-A' shown in the layout in FIG. 2.

FIG. 4 illustratively shows a section taken along line A-A' shown in FIG. 2 in the storage circuit STC.

In FIG. 4, isolation insulator 101 is embedded in a p-type semiconductor substrate 100, and an n-type diffusion layer area 102 in a pattern of active area FL is formed.

A gate insulator 103 of a transistor, a gate electrode 104 of the transistor, and a side-wall 105 formed from an insulator on a gate electrode side face of the transistor are formed on the p-type semiconductor substrate 100.

Further, a gate cap 106 formed from an insulator on the gate electrode is formed above the gate electrode 104 simultaneously of formation of the side-wall. A first metal layer 200 is used for connection of elements in the memory cell, and a second metal layer 201 is used for connection of the first through-hole and the second through-hole.

Further, a lower contact 300 is formed from poly-silicon at a first contact connecting a n-type diffusion layer area and the first metal layer, and an upper contact 301 is formed from the same material as that of the first metal layer at the first contact.

A third contact 302 is formed from the same material as that of the first metal layer so as to connect the gate electrode and the first metal layer, and a first through-hole 400 connects the first metal layer and the second metal layer in an interlayer insulator 500.

In FIG. 4, a node name is shown between parentheses subsequent to the layer name so as to correspond to FIG. 2. For example, it is easily understood from the node name shown by the gate electrode 104 in FIG. 4 that one electrode of the source and the drain of the transistor T1 and the gate electrode of the transistor T4 are connected to each other via the first metal layer 200 and the first and second contacts.

Incidentally, such a structure at the connection portion of the internal node is omitted in FIG. 4, but it is employed even in a circuit block arranged outside the memory array. For example, in the row decoder XDEC of the commodity DRAM, connection of an n-type diffusion layer area of one of the source and the drain of the transistor driving a word line and a word line formed from poly-silicon is performed using a similar structure.

Figure 5:
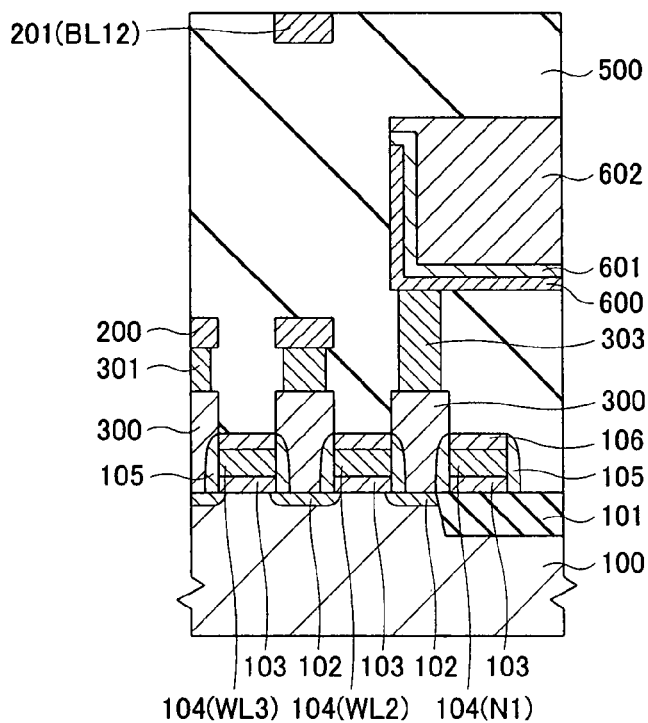
FIG. 5 is a sectional view showing a structure of a portion of the memory array taken along line B-B' shown in the layout in FIG. 2.

Further, FIG. 5 illustratively shows a section taken along line B-B' shown in FIG. 2 in the storage circuit STC.

A structure which is not shown in FIG. 4 will be explained below.

An upper contact 303 is formed from poly-silicon at the third contact connecting the n-type diffusion layer area 102 and a lower electrode of the capacitor. A lower electrode 600 of the capacitor is formed from poly-silicon, and an upper electrode 602, namely, a plate electrode is formed on a surface of the lower electrode 600 on an insulator 601.

In FIG. 5, a node name is shown between parentheses subsequent to the layer name so as to correspond to FIG. 2. For example, it is easily understood from the node name shown by the gate electrode 104 that the gate electrodes of the transistor T1 and the transistor T4 are disposed in parallel to each other.

Incidentally, a lower contact of the third contact has the same structure as that of the lower contact 300 of the first contact, and it is a so-called self-align contact (SAC) which is simultaneously formed so as to fill a clearance in the side-wall 105. The processing technique is called "self-aligned process" widely used in a commodity DRAM.

Further, the first metal layer 200, the upper contact 301 of the first contact, and the second contact 302 are formed from, for example, tungsten having a high melting point in order to prevent degradation of electrical characteristics due to thermal processing performed when a capacitor is formed on a layer above them.

Furthermore, as also shown in FIG. 4, it is easily understood that a connection portion between a bit line BL12 formed in a layer between the second metal layer 201 and the n-type diffusion layer area 102 and the memory cell is shared by adjacent memory cells.

Figure 6:
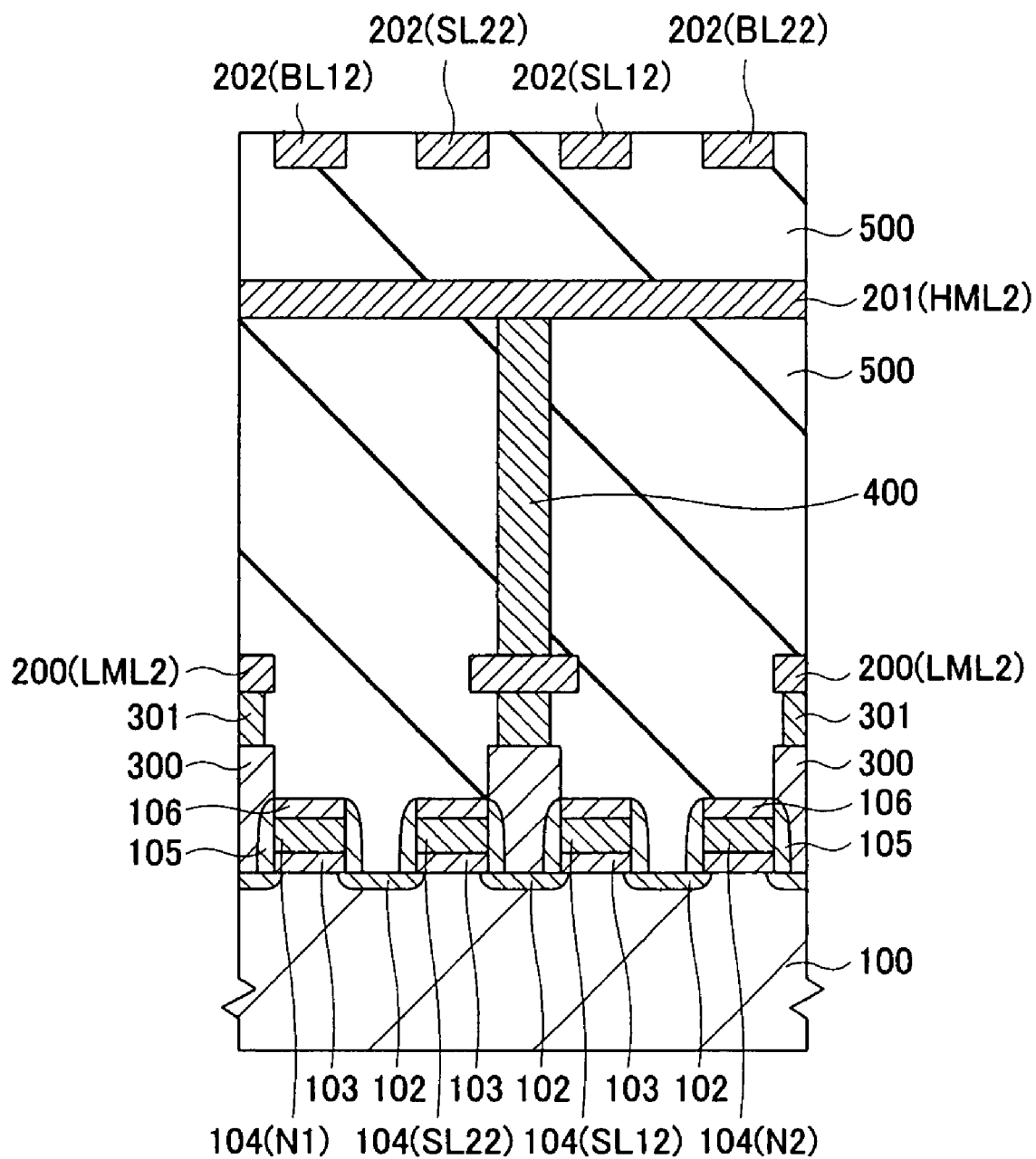
FIG. 6 is a sectional view showing a structure of a portion of the memory array taken along line C-C' shown in the layout in FIG. 3.

Moreover, FIG. 6 illustratively shows a section taken along line C-C' shown in FIG. 3 in the comparator CP.

In FIG. 6, the bit line and the search line are formed using the third metal layer 202. In FIG. 6, a node name is shown between parentheses subsequent to the layer name so as to correspond to FIG. 4. It is easily understood from, for example, the node name shown by the gate electrode 104 in FIG. 6 that the gate electrodes of the transistors T3, T4, T5, T6 in the comparator CP are arranged in parallel to one another.

With such a constitution, the lower contact 300 of the first contact is also formed using the above-described self-aligned process in the comparator PC. Further, these contacts are shared by adjacent transistors.

Figure 7:
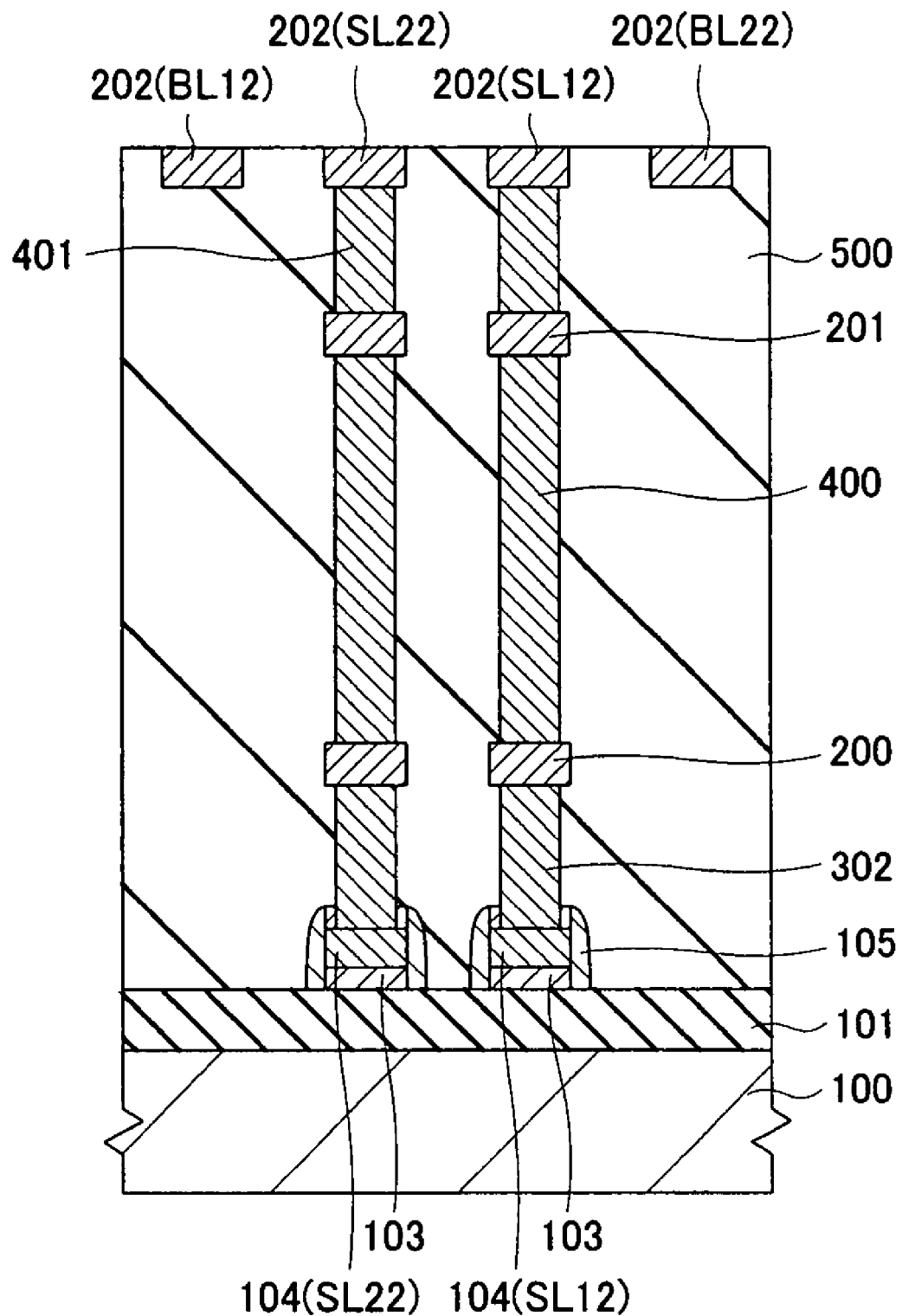
FIG. 7 is a sectional view showing a structure of a portion of the memory array taken along line D-D' shown in the layout in FIG. 3.

Further, FIG. 7 illustratively shows a section taken along line D-D' shown in FIG. 3 in the comparator CP.

A second through-hole 401 connects the second metal layer and the third metal layer. The transistors T3, T5, and the search line pairs SL12, SL22 are connected respectively using the second contact 302, the first through-hole 400, and the second through-hole 401.

It is easily understood considering the layout shown in FIG. 3 that these structures are shared by adjacent memory cells. Incidentally, though not shown in sections shown in FIG. 4 and FIG. 5, it is easily understood from FIG. 7 that the bit lines BL12, BL22 formed from the third metal layer 305 and the transistors T1, T2 are connected via the second through hole 401 like the search line.

According to the above-described memory cell structure, four effects described below can be obtained.

The first effect lies in that a matching margin such as considered in an embedded DRAM can be reduced by using a self-aligned process similar to the commodity DRAM.

The second effect lies in that connection of an internal node of a memory cell can be realized by the same processing step as that for a circuit block arranged outside a memory array of a commodity DRAM by using the first and second contacts and the first metal layer.

The third effect lies in that a cell area can be suppressed by sharing a connection portion of a memory cell and a bit line pair, a search line pair, or a match line pair with adjacent memory cells.

The fourth effect lies in that while the number of parasitic capacitances occurring at the low voltage side match lines is made equal to that of occurring at the high voltage side match lines by the side-wall insulators, load capacitances of respective match lines in the match line pair are made approximately equal to each other by sharing a connection portion between the low voltage side match line and the memory cell with an adjacent memory cell and arranging the match line pair using the same second metal layer.

The fourth effect is suitable for charge-sharing operation reducing amplitude of the match line pair while generating a comparison signal voltage with a sufficient capacitance in search operation described later. By the above effects, a memory cell which allows charge-sharing operation can be realized with a small area.

Finally, assuming that the following four rules are applied in the layout shown in FIG. 2 and FIG. 3 as one example, a memory cell area is calculated.

The first rule is that the minimum value of a wire width and a spacing between wires on each layer is set to F (F is the minimum feature size). The second rule is that patterns of each contact and each through-hole is set to a square with one side of F. The third rule is that a matching margin of each contact is made zero. The fourth rule is that a matching margin between each through-hole and each metal layer is set to F/4 only in two directions.

By using the four layout rules, since the transistors T3, T4, T5, T6 in the comparator can be arranged with the minimum spacing, the cell width becomes 8 F. Further, since the word lines WL can be arranged with a pitch of 10.25 F, $82 \times F^2$ memory cells can be realized.

Next, a simplified equivalent circuit model of a memory cell obtained by considering a parasitic capacitance in the memory cell structure explained above will be explained.

Figure 8:
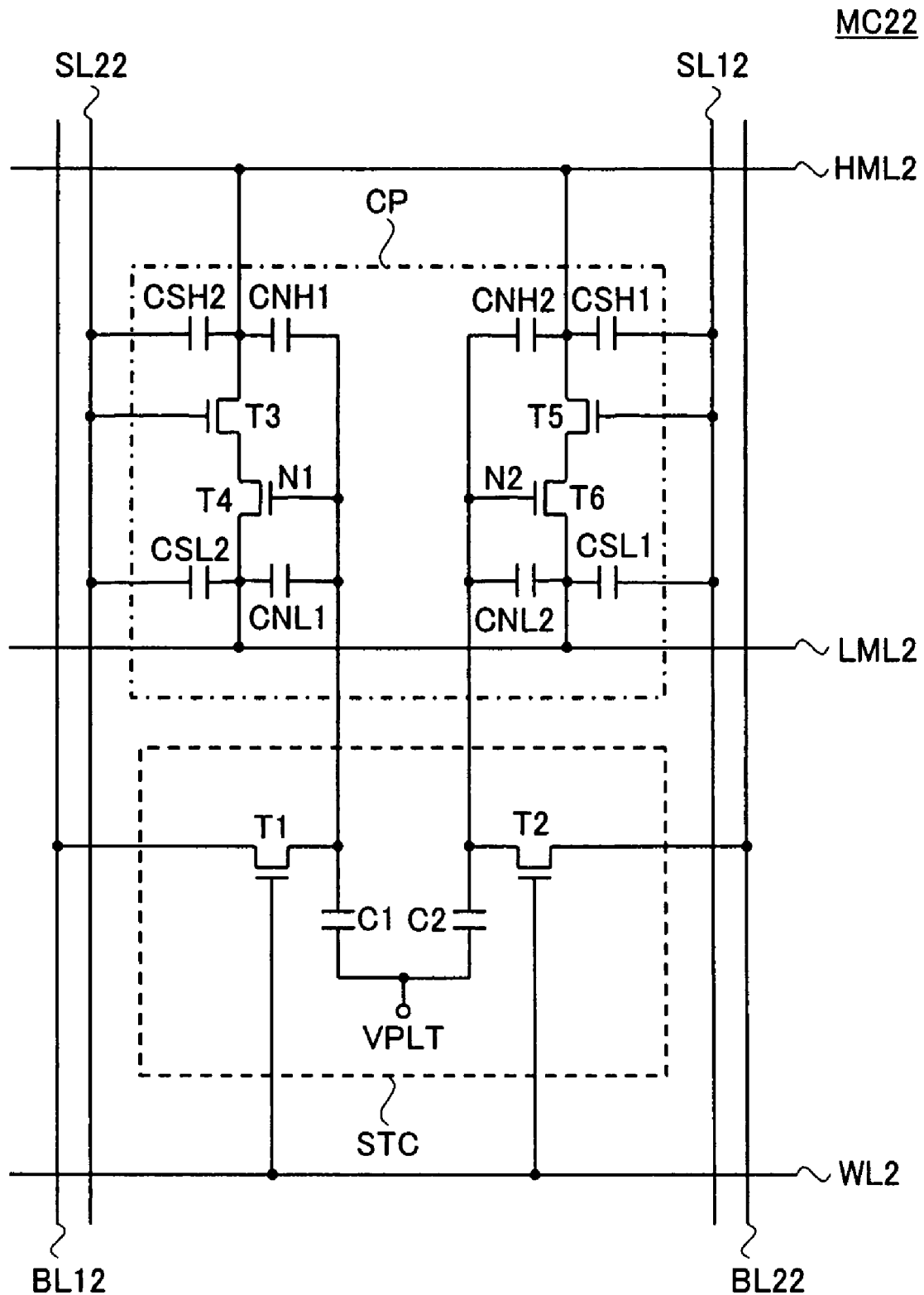
FIG. 8 is a diagram showing one example of a simplified equivalent circuit obtained by considering a parasitic capacitance in the memory cell in FIG. 1.

FIG. 8 shows a simplified equivalent circuit model of the memory cell MC22 in the memory array shown in FIG. 1.

Capacitances CSH1, CSH2 are parasitic capacitances occurring between the search lines SL12, SL22 and the high voltage side match line HML2, respectively. Further, capacitances CSL1, CSL2 are parasitic capacitances occurring between the search lines SL12, SL22 and the low voltage side match line LML2, respectively.

Further, the capacitances CNH1, CNH2 are parasitic capacitances occurring between the storage nodes N1, N2 and the high voltage side match line HML2, and the capacitances CNL1, CNL2 are parasitic capacitances occurring between the storage nodes N1, N2 and the low voltage side match line LML2, respectively.

Figure 9:
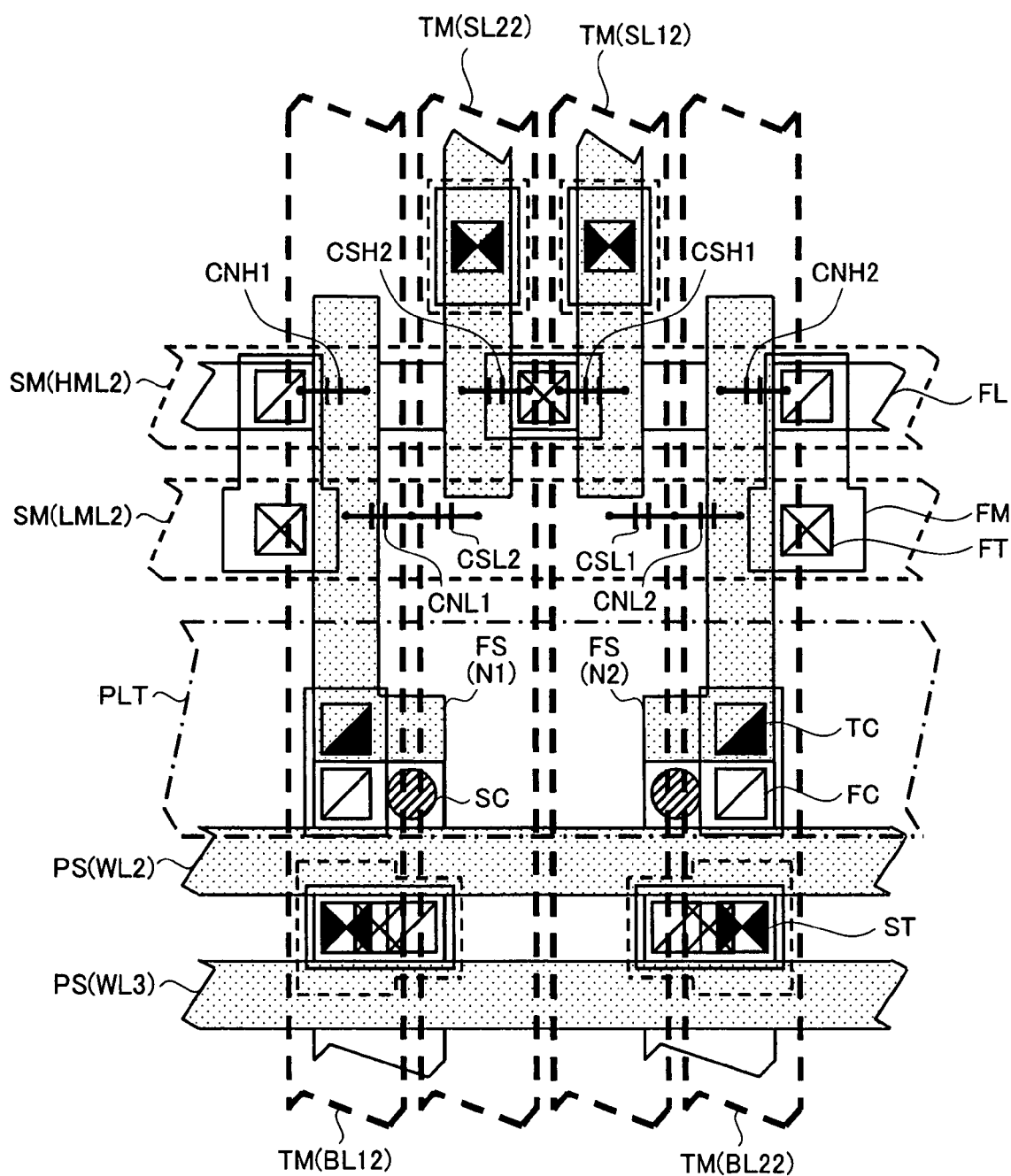
FIG. 9 is a view illustratively showing a parasitic capacitance in the memory array in FIG. 8 on the layout shown in FIG. 3.

FIG. 9 illustratively shows positions where parasitic capacitances are generated by writing the parasitic capacitances on the layout shown in FIG. 3.

The parasitic capacitances CSH1, CSH2 are generated because the high voltage side match line HML2 passes through between the poly-silicon layers 104 forming the gate electrodes respectively connected to the search lines SL12, SL22, considerably near to the gate electrodes at a portion of the lower contact 300 of the first contact, as shown in FIG. 6.

The thickness of the side-wall insulator 105 is about 30 nm when a microfabrication where the minimum feature size is 0.13 µm is used. On the other hand, the thickness of an interlayer insulator 500 between the second metal layer 201 for forming the high voltage side match line HML2 and the third metal layer 202 for forming the search lines SL12, SL22 is several hundreds nm. Therefore, the capacitances of the parasitic capacitances CSH1, CSH2 are approximately determined according to a shape of a portion where the gate electrode and the first contact sandwiches the side-wall insulator 105.

Similarly, the capacitances CNL1, CNL2 occur because the low voltage side match line LML1 passes through considerably near the poly-silicon layers 104 forming the gate electrodes of the transistors T4, T6 respectively connected to the storage nodes N1, N2, at a portion of the lower contact 300 of the first contact. The capacitances of the parasitic capacitances CSH1, CSH2 and the capacitances of the parasitic capacitances CNL1, CNL2 are approximately equal to each other due to similarity of their structure.

The parasitic capacitances CNH1, CNH2 are generated respectively by an interlayer insulator 500 between the poly-silicon layer 104 forming the gate electrodes of the transistors T4, T6 and the second metal layer 201 forming the high voltage side match line HML2.

The thickness of the interlayer insulator at this portion is approximately equal to the height of the capacitor shown in FIG. 5 and it is about 1 µm. Therefore, the capacitances of the parasitic capacitances CNH1, CNH2 are considerably smaller than the capacitances of the parasitic capacitances CNL1, CNL2.

It is easily understood from the layout shown in FIG. 9 and a positional relationship between the search lines SL12, SL22 and the high voltage side match line HML2 that the parasitic capacitances CSL1, CSL2 are generated by an interlayer insulator 500 between the second metal layer 201 forming the low voltage side match line LML2 and the third metal layer 202 forming the search lines SL12, SL22. Therefore, the capacitances of the parasitic capacitances CSL1, CSL2 are considerably smaller than the capacitances of the parasitic capacitances CSH1, CSH2.

Incidentally, it is easily understood that parasitic capacitances similar to the parasitic capacitances CSL1, CSL2 occur between the bit line pair and the match line pair in an actual structure. In FIG. 8 and FIG. 9, however, attention is paid to a parasitic capacitance between the search line pairs activated according to search operation and a parasitic capacitance occurring between the bit lines is omitted in order to simplify explanation of the search operation described below.

Figure 10:
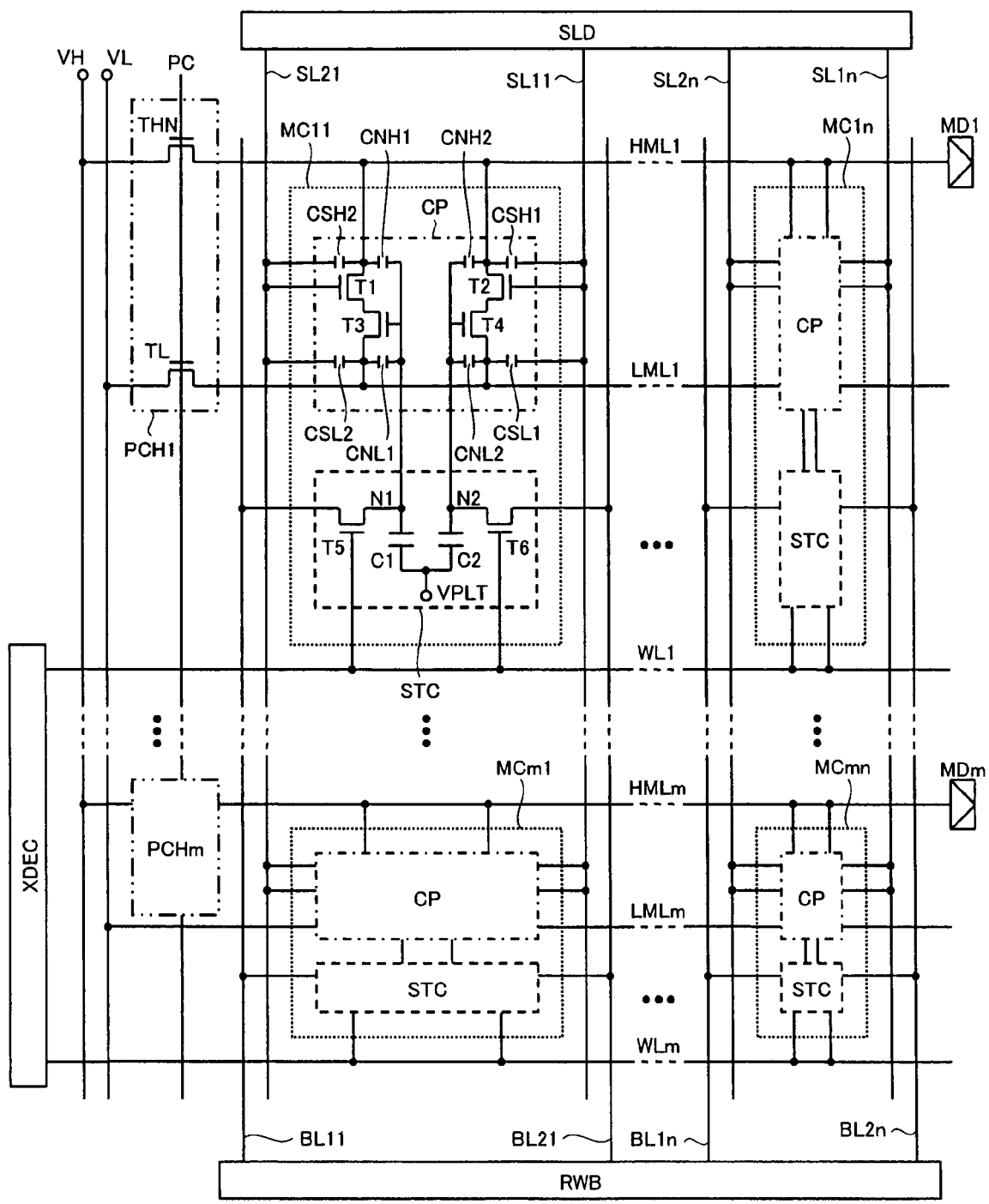
FIG. 10 is a diagram showing one example of a simplified equivalent circuit obtained by considering a parasitic capacitance in the memory array shown in FIG. 1.

FIG. 10 shows a memory array structure according to FIG. 1 using the simplified equivalent circuit model shown in FIG. 8.

A search operation about a first row entry will be explained below while attention is paid to the memory cell MC11. Incidentally, it is assumed that the memory cell MC11 reserves stored data '1' in the storage circuit STC. In this case, the logical value of the storage node is (N1, N2)=(1, 0), and the storage node N1 is held at the external power supply VDD, while the storage node N2 is held at the ground potential VSS. Therefore, the transistor T4 is conductive, while the transistor T6 is put in a cut-off state.

First of all, a search operation performed when the search key and the entry are the same will be explained with reference to FIG. 11.

First, in a standby state, by driving the precharge enable signal PC to a boosted dc voltage VDH to activate transistors THN, TL in the precharge circuit PCH1, the high voltage side match line HML1 and the low voltage side match line LML1 are driven to the precharge voltage VH and the precharge voltage VL, respectively. In FIG. 11, an operation timing example when the precharge voltage VH is the external power supply VDD and the precharge voltage VL is the ground potential VSS is shown. Further, the boosted dc voltage VDH is set to a voltage higher than the external power supply VDD such that the transistor THN is made sufficiently conductive. For example, when the threshold voltage of the transistor THN is represented as VTN, setting is made so as to satisfy a relationship of VDH>VH+VTN (here, VDH>VDD+VTN).

When the search operation starts, by driving the precharge enable signal PC put at the boosted dc voltage VDH to the ground potential VSS, the transistors THN, TL in the precharge circuit PCH1 are each put in an cut-off state so that match lines HML1, LML1 are put in a floating state.

Subsequently, the search key is inputted through the search line pair. When the data of the search key to be compared with the stored data in the memory cell MC11 is '1', the logical value of the search line is (SL11, SL21)=(1, 0), so that the search line SL11 held at the ground potential VSS is driven to the external power supply VDD and the search line SL21 is held at ground potential VSS.

Here, the high voltage side match line HML1 is coupled to the search lines SL11, SL12 via the parasitic capacitances CSH1, CSH2 and it is coupled to the storage nodes N1, N2 via the parasitic capacitances CNH1, CNH2. The voltage of high voltage side match line HML1 rises due to coupling with the search line SL11 activated.

That is, search-line noise is generated at the high voltage match line HML1. Incidentally, though omitted in FIG. 10, since an actual search key is data constituted of a plurality of bits, search-line noises are convoluted when a plurality of search lines are simultaneously driven.

Figure 11:
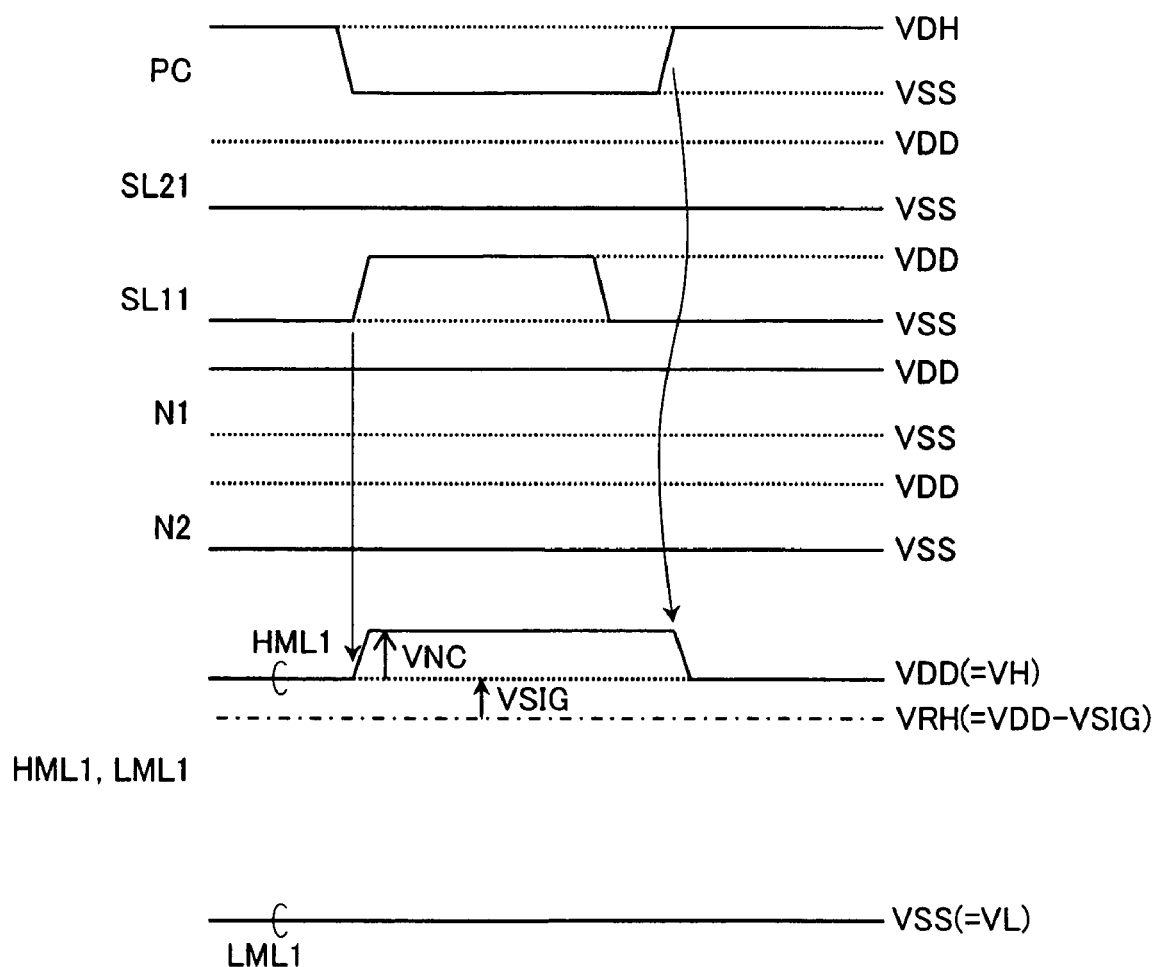
FIG. 11 is a diagram showing one example of a search operation timing when a match entry has been detected in the memory array shown in FIG. 10.

Accordingly, the search-line noise VNC shown in FIG. 11 reaches a value corresponding to the number of search lines driven. On the other hand, the low voltage side match line LML1 is coupled to the storage nodes N1, N2 via the parasitic capacitances CNL1, CNL2 and is coupled to the search lines SL11, SL12 via the parasitic capacitances CSL1, CSL2.

Though only the search line SL11 among them is driven, as described above, the parasitic capacitance CSL1 is remarkably small, so that voltage rising of the low voltage side match line LML1 due to coupling with the search line SL11 is vanishingly small as compared with the high voltage side match line HML1. Therefore, in FIG. 10, the voltage of the low voltage side match line LML1 after actuating the search line SL11 is held at the ground potential VSS.

Now, the transistor T5 in the memory cell MC11 is made conductive by inputting of the search key, but since the transistor T6 is in a cut-off state, no current flows to the storage node N2 in the comparator CP. Further, since transistor T3 is held in the cut-off state, no current flows to the storage node N1.

Accordingly, the comparator CP in the memory cell MC11 is in a matched state. Similarly, when each of the comparators CP in the other memory cells MCls (s=1, 2, . . . , n) is in a matched state, connection of the match line pairs is held at disconnected state.

Accordingly, the high voltage side match line HML1 is held at the precharge voltage VH or higher (here, the external power supply VDD or higher), while the low voltage side match line LML1 is held at the ground potential VSS.

As a result, the match detector MD1 discriminates that the voltage of the high voltage side match line HML1 is higher than the reference voltage VRH and a voltage equal to or higher than a positive comparison signal voltage (VSIG) has been generated to detect that the first row entry has matched with the search key.

Finally, by driving the search line SL11 put at the external power supply VDD to the ground potential VSS and further driving the precharge enable signal PC put at the ground potential VSS to a boosted dc voltage VDH to precharge the match lines of the match line pairs respectively, the search operation is terminated.

Incidentally, the reference voltage VRH is set so as to be capable of discriminating a high voltage side match line voltage when the match detector is held at the precharge voltage VH accurately. For example, when a signal voltage required for the match detector to discriminate a comparison signal accurately is represented as VSIG, setting is made so as to satisfy VRH=VH−VSIG (here, VRH=VDD−VSIG).

Next, a search operation performed when the search key and the entry are different from each other will be explained with reference to FIG. 12.

An operation for making the precharged match line pair to a floating state to input the search key is as described above. A search operation performed when data of the search key to be compared with the entry in the memory cell MC11 is '0' will be explained below. In this case, since the logical value of the search line is (SL11, SL21)=(0, 1), the search line SL21 put in the ground potential VSS is driven to the external power source VDD while the search line SL11 is held at the ground potential VSS.

Here, the voltage of the high voltage side match line HML1 rises due to coupling with the search line SL21 via the parasitic capacitance CSH2 like the case shown in FIG. 11.

Now, since the transistor T3 in the memory cell MC11 is made conductive by inputting of the search key, a current path is formed on the side of the storage node N1 in the comparator CP so that the match lines of the match line pair are short-circuited. That is, the high voltage side match line HML1 precharged to the external power supply VDD is discharged so as to approach to an intermediate voltage VDD/2, while the low voltage side match line LML1 precharged to the ground potential VSS is charged to approach to the intermediate voltage VDD/2.

As a result, the match detector MD1 discriminates that a negative comparison signal voltage (−VSIG) is generated from such a fact that the voltage of the high voltage side match line HML1 is lower than the reference voltage VRH by VSIG to determine the first row entry has unmatched with the search key.

Finally, by driving the search line SL21 put at the external power supply VDD to the ground potential VSS and further driving the precharge enable signal PRE held at the ground potential VSS to a boosted dc voltage VDH to precharge the match lines of the match line pair, the search operation is terminated.

Figure 12:
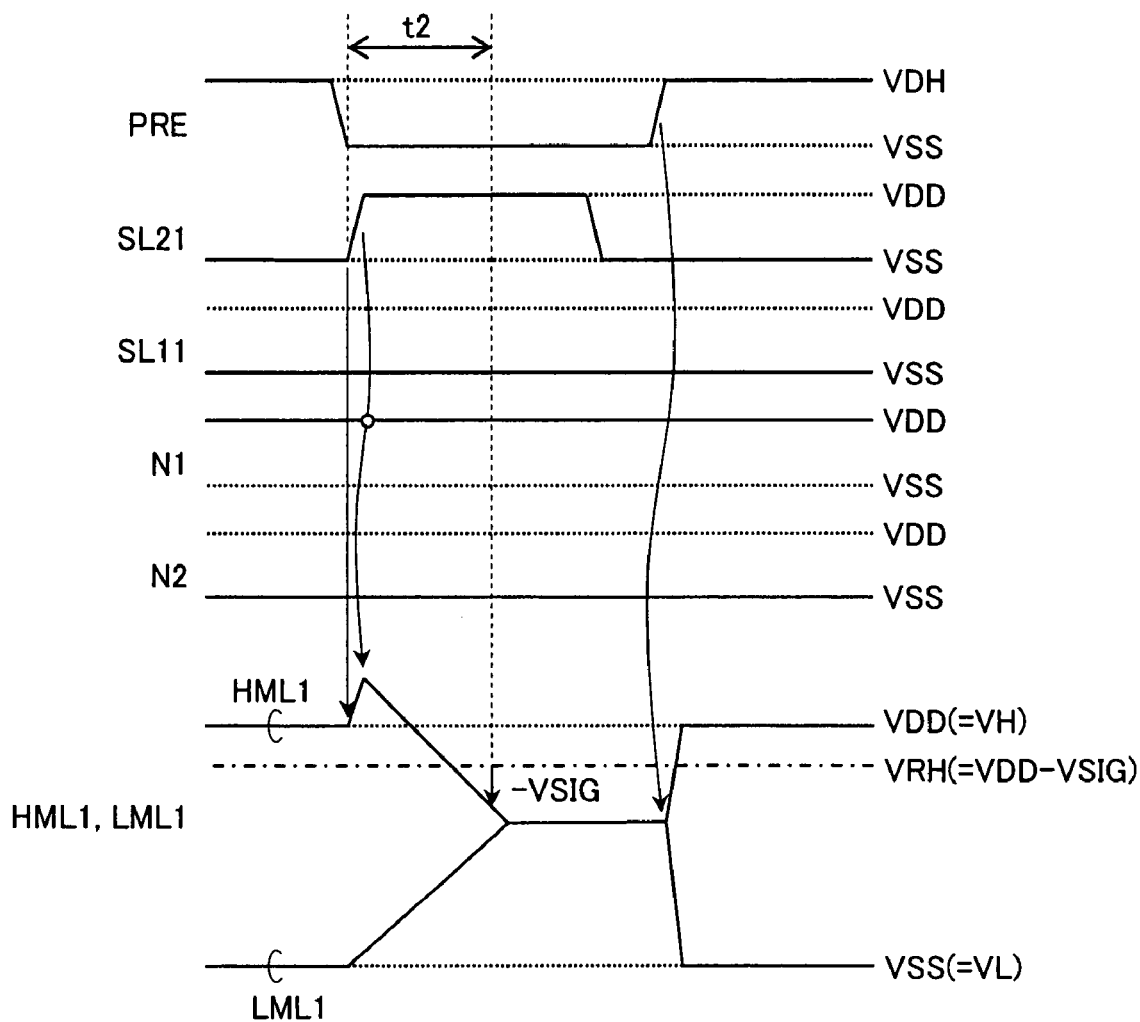
FIG. 12 is a diagram showing one example of a search operation timing when an unmatch entry has been detected in the memory arrays shown in FIG. 10.

Incidentally, in FIG. 12, a match line pair waveform when the other memory cells MCls (s=2, 3, . . . , n) have been in matched state is shown in order to explain an operation timing under the worst condition.

However, when the other memory cells MCls (s=2, 3, . . . , n) have been in unmatched state, since the match line pair is short-circuited by current paths formed in a plurality of memory cells, it is apparent that arrival at the vicinity of the intermediate voltage VDD/2 becomes earlier than the waveform illustrated. That is, the high voltage match line HML1 reaches the voltage level (VR−VSIG) at a time period shorter than the search time t2 illustrated.

In the present embodiment, as described regarding the structure of the memory cell, designing is performed such that parasitic capacitances of the match lines of the match line pairs become equal. However, such explanation that the voltage of the match line pairs after short-circuited is near the intermediate voltage VDD/2 has been made considering unbalance of a load capacitance occurring due to that the match detector is connected to only high voltage side match line HML1 which is one of the match lines and such a fact that the search-line noise occurs only in the high voltage side match line HML1 which is one of the match lines.

Effects obtained based upon the constitution and the operation of the memory array described above are collectively described below.

The first effect lies in that power consumption can be reduced. In this memory array, by making the match line pair whose match lines have been precharged to different voltages to a floating state and input the search key via the search line pair, a signal corresponding to the comparison result of data is generated at the high voltage side match line according to the charge-sharing operation, so that a voltage amplitude of the high voltage side match line is suppressed to about half of the precharge voltage difference between the match lines of the match line pair. Therefore, power required for precharge operation for the match line can be reduced.

The second effect lies in that a time required for the search operation can be shortened. Since the match line pair is coupled to the search line pair via the parasitic capacitances CSH1, CSH2, CSL1, CSL2, search-line noise occurs in the match line pair. However, since the parasitic capacitances CSL1, CSL2 are remarkably small, voltage rising of the low voltage side match line is vanishingly small. Therefore, since the transistors T3, T4, T5, T6 for comparing data can avoid lowering of the driving ability thereof due to lowering of the gate-source voltage or rising of the threshold voltage caused by the substrate bias effect, the search time can be shortened. That is, a time required for the search operation can be shortened.

The third effect lies in that a matching margin for a mask can be reduced by introducing a self-aligned process widely used for a commodity DRAM. First, the gate electrodes of the transistors T3, T5 are formed in an L shape, and the gate electrodes of the transistors T4, T6 and two word lines are arranged at the minimum intervals. The gate electrodes of transistors T3, T4, T5, T6 are arranged in parallel with each other at the minimum intervals. Since the first and third contacts can be formed between the gate electrodes using the self-aligned process according to the above layout, an area of the memory cell can be suppressed.

The fourth effect lies in that the TDCAM cell can be formed using the manufacturing process as the commodity DRAM. That is, since connection of an internal node for a memory cell can be realized using the first and third contacts and the first metal layer like the circuit block arranged outside the memory array, the manufacturing steps for the commodity DRAM can be applied as it is.

The fifth effect lies in that a bit line pair, a search line pair, and a connection portion of a match line pair and a memory cell are shared by an adjacent memory cell so that a cell area can be suppressed.

The sixth effect lies in that load capacitances of the match lines of the match line pair can be made approximately equal to each other. That is, first, by causing a connection portion of the low voltage side match line and a memory cell to be shared by an adjacent memory cell and forming the match lines of the match line pair using the same second metal layer, load capacitances of match lines of the match line pair can be made approximately to the same value, while the parasitic capacitance occurring in the low voltage side match line due to the side-wall insulator is made equal to the parasitic capacitance occurring in the high voltage side match line, so that the voltage of the match line pair after short-circuited can be made to about the intermediate voltage VDD/2. Accordingly, a stable charge-sharing operation where the voltage amplitude of the match line pair is suppressed to about half of the external power supply VDD while a comparison signal voltage with a sufficient capacitance is generated can be realized. According to the above-described six effects, a large capacity TCAM which performs a search operation at low power and at high speed can be realized.

Next, another example of a constitution of a memory array will be explained with reference to FIG. 13.

The feature of the constitution lies in that the match detector MDr (r=1, 2, . . . , m) are connected to the low voltage side match lines LmLr (r=1, 2, . . . , m) using a memory cell having the same constitution as that of the memory array shown in FIG. 1.

Figure 13:
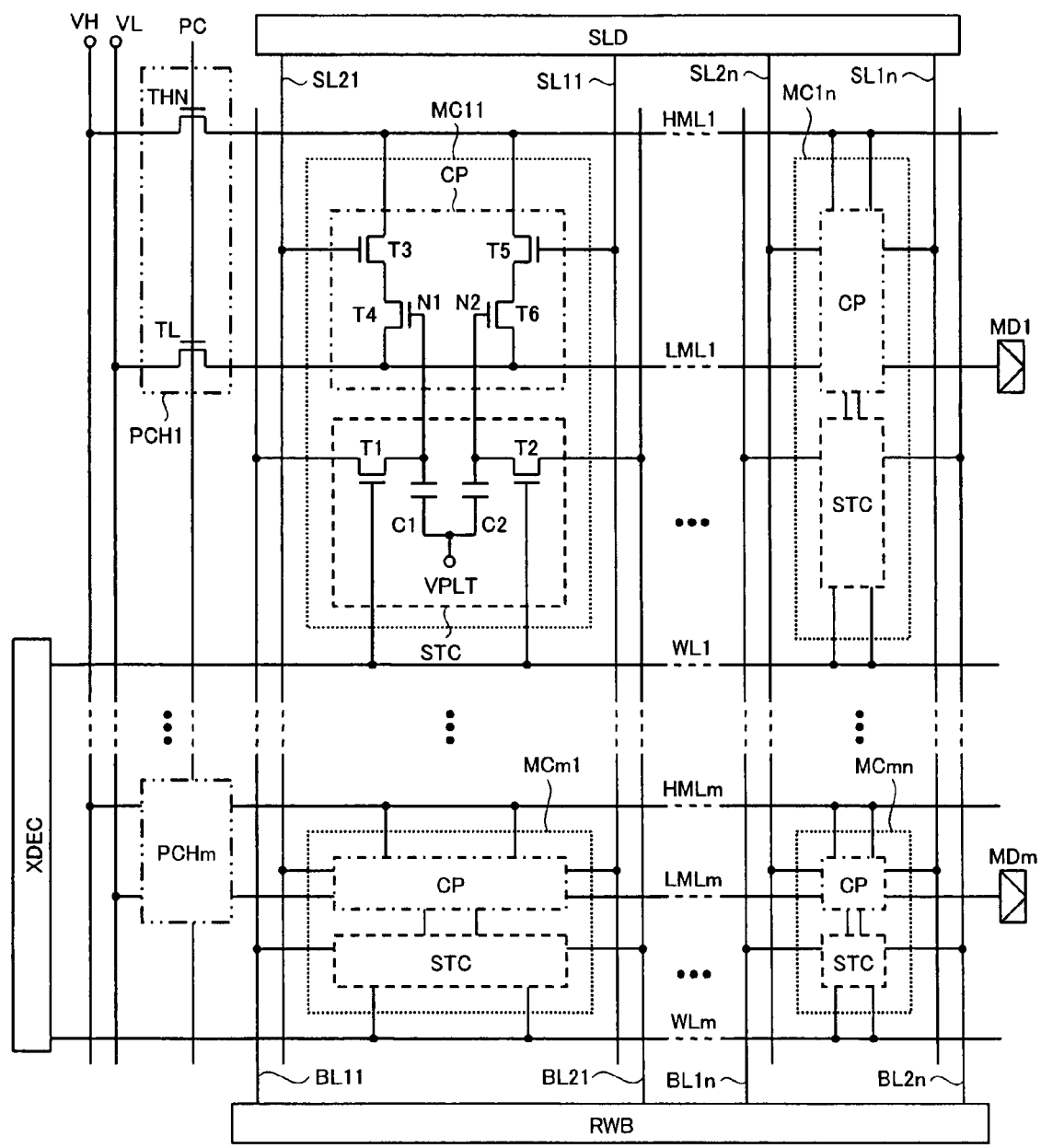
FIG. 13 is a diagram showing another constituent example of a memory array using a memory cell configured of six transistors and two capacitors according to the first embodiment of the present invention.
Figure 14:
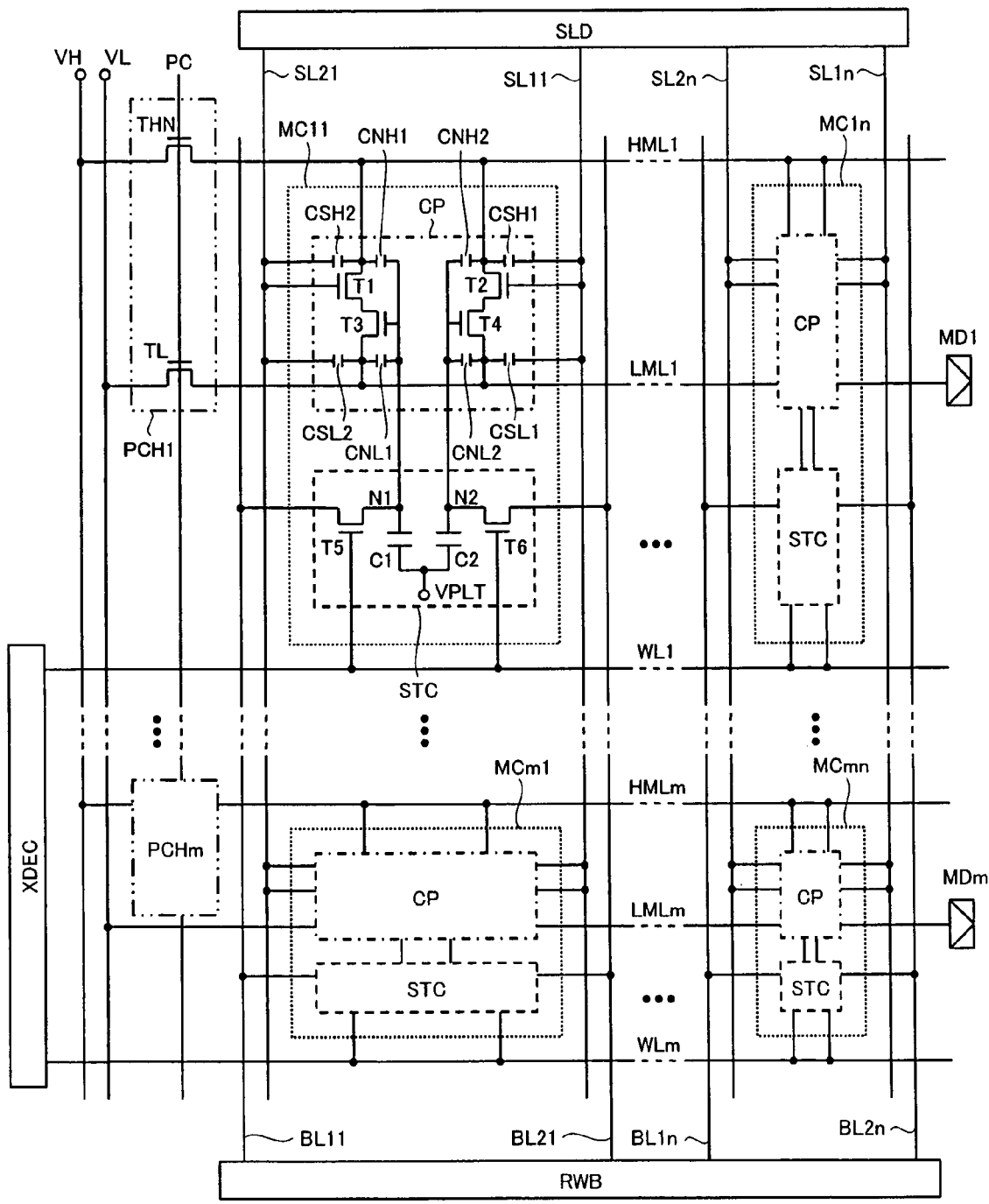
FIG. 14 is a diagram showing one example of a simplified equivalent circuit obtained by considering a parasitic capacitance in the memory array shown in FIG. 13.

FIG. 14 shows a memory array structure obtained by applying the simplified equivalent circuit model of the memory cell described in FIG. 8 and FIG. 9 to FIG. 13. A search operation in the memory array shown in FIG. 14 will be explained below with reference to FIG. 15 and FIG. 16.

Figure 15:
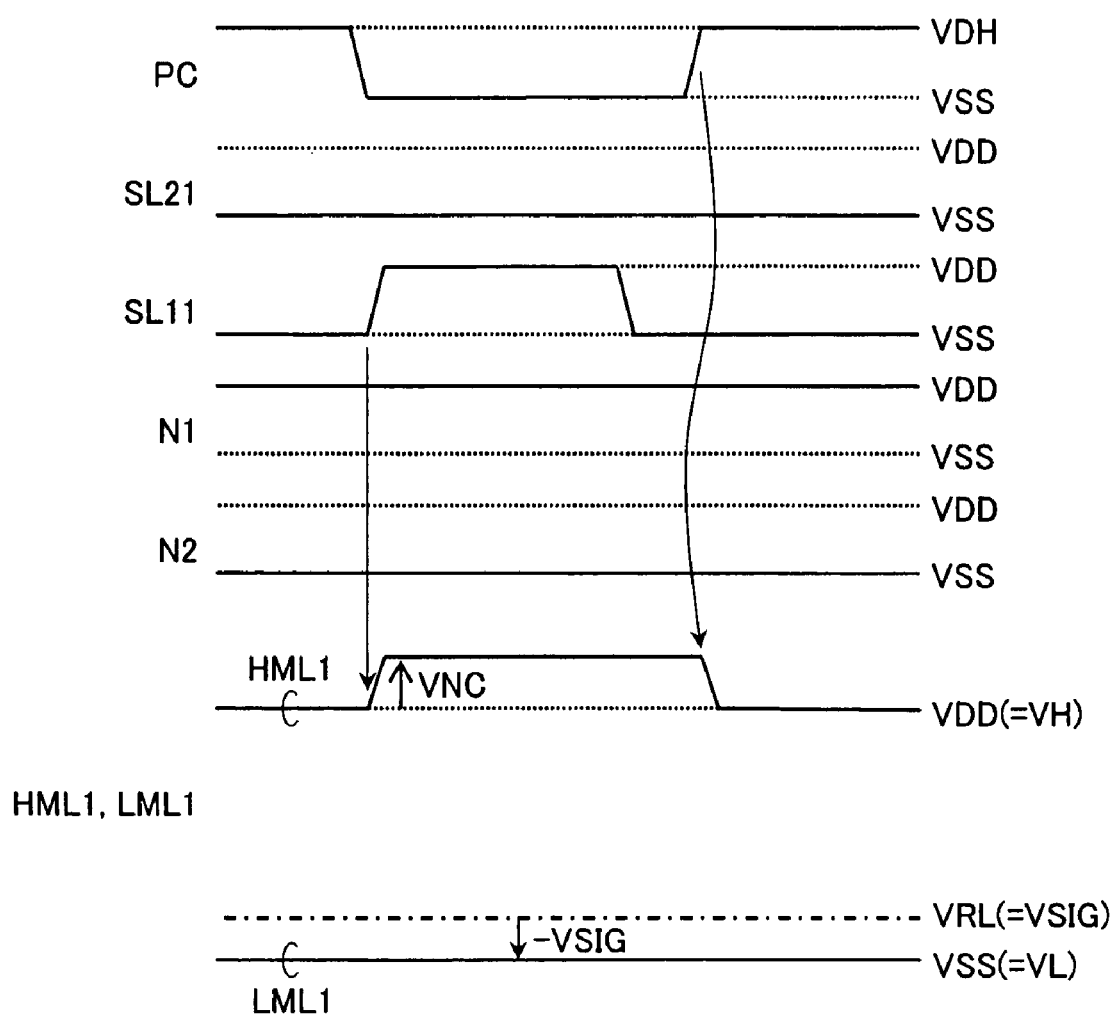
FIG. 15 is a diagram showing one example of a search operation timing when a match entry has been detected in the memory array shown in FIG. 14.

FIG. 15 shows a search operation timing when a search key and an entry are matched with each other. After the match line pair put in precharged state is made to a floating state, the search line SL11 put in the ground potential VSS is driven to the external power supply VDD in order to compare the stored data (entry) '1' in the memory cell MC11 and a search key '1' with each other like the case shown in FIG. 11.

At this time, since the comparator PC is in a matched state, connection of the match line pair is held in a disconnected state. Therefore, the high voltage side match line HML1 coupled to the search line SL11 via the parasitic capacitance CSH1 is raised to a voltage higher than the precharge voltage VH (here, the external power supply VDD) to be held at the voltage due to search-line noise. On the other hand, the low voltage side match line LML1 is coupled to the search line SL11 via the parasitic capacitance CSL1, but search-line noise is vanishingly small due to weakness of the coupling, the low voltage side match line LML1 is held at an approximately precharge voltage (here, the ground potential VSS).

In FIG. 15, the reference voltage VRL is set to a voltage higher than the ground potential VSS by VSIG, and the match detector MD1 discriminates that a negative comparison signal (here, −VSIG) relative to the reference voltage VRL is generated at the low voltage side match line LML1 to determine that the first entry has matched with the search key.

Figure 16:
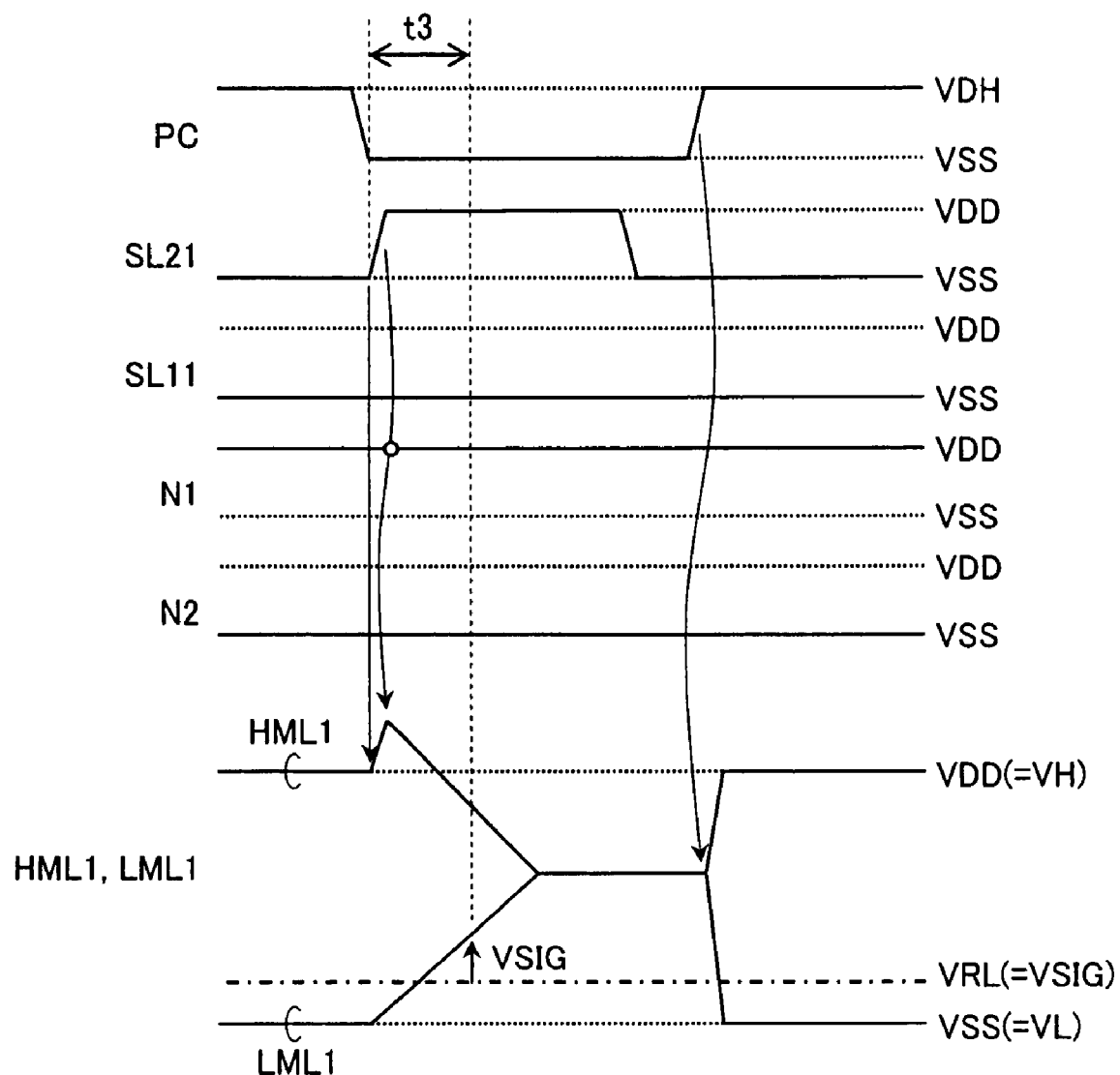
FIG. 16 is a diagram showing one example of a search operation timing when an unmatch entry has been detected in the memory arrays shown in FIG. 14.

FIG. 16 shows a search operation timing when the search key and the entry are different from each other.

After the match line pair put in precharged state is made to a floating state, the search line SL21 put in the ground potential VSS is driven to the external power supply VDD in order to compare the entry '1' in the memory cell MC11 and the search key '0' with each other like the case shown in FIG. 12.

At this time, since the comparator CP is put in an unmatched state, the low voltage side match line LML1 is charged to the intermediate voltage VDD/2 due to short-circuiting of the match line pairs.

Accordingly, the match detector MD1 discriminates that a positive comparison signal (here, VSIG) is generated at the low voltage side match line LNL1 at a timing at which the low voltage side match line LML1 has exceeded the reference voltage VRL by VSIG, namely, at a timing at which time t3 has elapsed from driving of the search line to determine that the first entry has unmatched with the search key.

An effect obtained by the above structure and operation lies in that the search operation can be performed with a time period shorter than that in the memory array shown in FIG. 1. That is, as explained in FIG. 11, since the voltage on the high voltage side match line put in an unmatched state is once raised due to search-line noise and then discharged in the memory array structure shown in FIG. 1, a time (a search time t2) required for generating a negative comparison signal (−VSIG) is long.

On the other hand, since the low voltage side match line is hardly influenced by search-line noise to be charged, the search time t3 shown in FIG. 16 is shorter than the time t2. Accordingly, when a structure that the match detector is connected to the low voltage side match line is adopted instead of a structure that the match detector is connected to the high voltage side match line as shown in FIG. 14, it is made possible to perform the search operation in further shorter time.

SECOND EMBODIMENT

Figure 17:
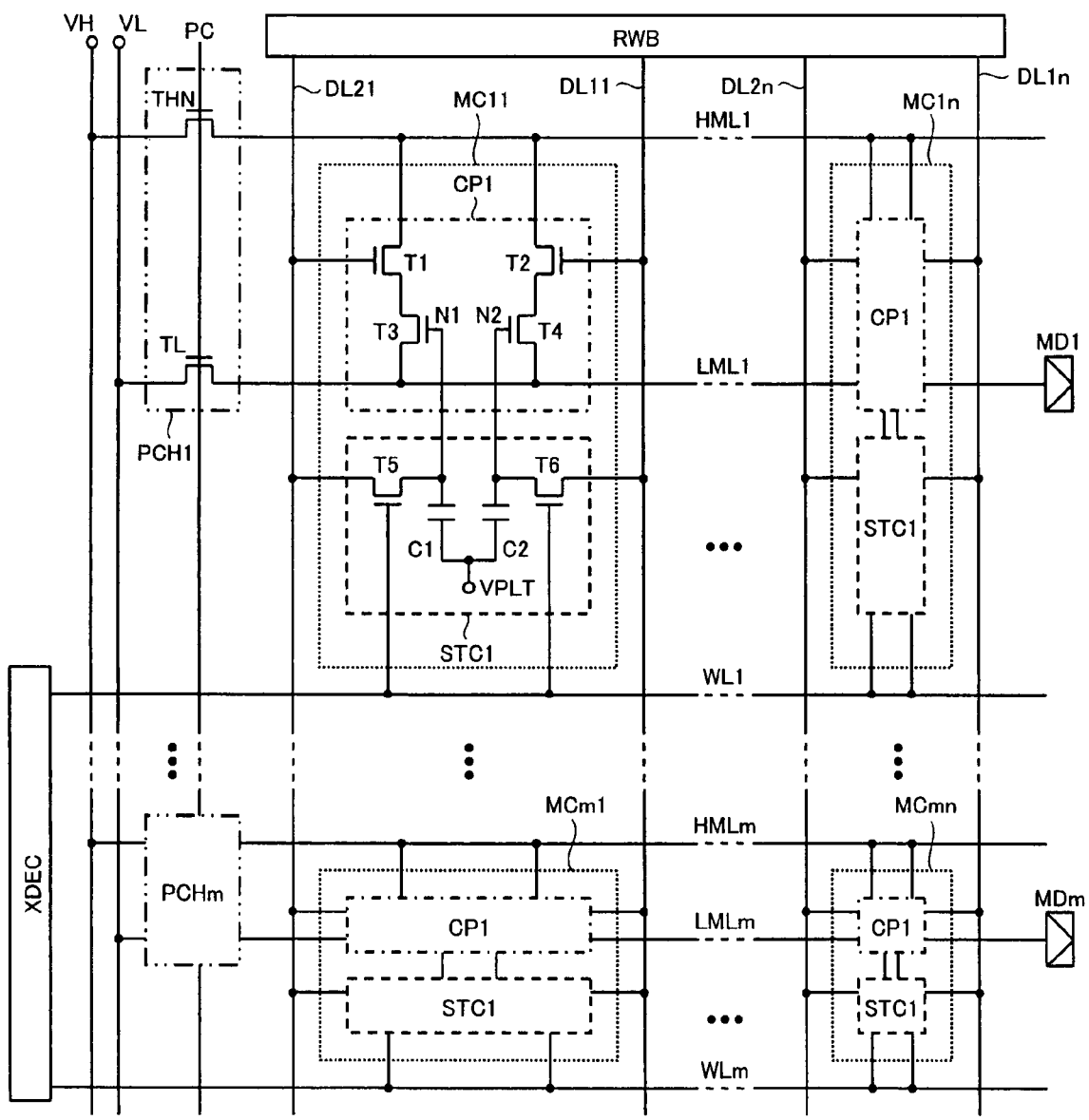
FIG. 17 is a diagram showing another constituent example of a memory array using a memory cell configured of six transistors and two capacitors according to a second embodiment of the present invention.

In a second embodiment, another structure and operation in a memory array will be explained. FIG. 17 shows a memory array in this embodiment, where a structure having a memory cell with m×n bits like the memory cell shown in FIG. 13 is shown. Further, the memory cell is configured of two capacitors and six transistors.

The feature of the structure shown in FIG. 17 lies in that a plurality of data lines DL1s, DL2s (s=1, 2, ..., n) are arranged so as to be orthogonal to a plurality of word lines WLr (r=1, 2, ... m) and a plurality of match line pairs, and memory cells are disposed at these intersecting points. In the following, two data lines corresponding to each other are called "data line pair".

The data lines constitutes a pair corresponding to a memory cell connected to the data lines and they are connected to a read-write circuit block RWB, respectively. The read-write circuit block RWB is configured of a plurality of sense amplifiers and precharge circuits connected to the data lines, respectively, as described in FIG. 1 for the first embodiment.

However, the sense amplifiers drive data lines to a voltage corresponding to an entry or a search key, respectively. That is, it is easily understood from a truth table shown in Table 1 that polarities of the data line pair driven according to binary data (data '1' and data '0') in case of an entry and in case of a search key are reversed to each other.

With such a structure, the search-line driver SLD for driving the search line pairs in a column direction such as shown in FIG. 13 or FIG. 1 can be removed so that an array area can be reduced.

Incidentally, in FIG. 17, a structure that the match detectors MDs (s=1, 2, ..., m) are connected to the low voltage side match lines LMLs (s=1, 2, ..., m) is shown, but a structure in which the match detectors MDs (s=1, 2, ..., m) are connected to the high voltage side match lines HMLs (s=1, 2, ..., m) may be adopted.

As described in the first embodiment, however, the structure shown in FIG. 17 is more suitable for shortening the search time. Further, by applying a layout and a structure of a memory cell such as explained in FIG. 2 to FIG. 7 regarding the first embodiment, it is possible to realize a memory cell having a small area.

THIRD EMBODIMENT

In the above, assuming that the voltage amplitudes of the search line pair and the storage node, namely, the search line pair and the bit line pair are equal to each other, range from the ground potential VSS to the external power supply VDD, various memory array structures and search operations have been explained, as shown in FIG. 15 or FIG. 16. In the third embodiment, another voltage setting in these memory arrays will be explained.

Figure 18:
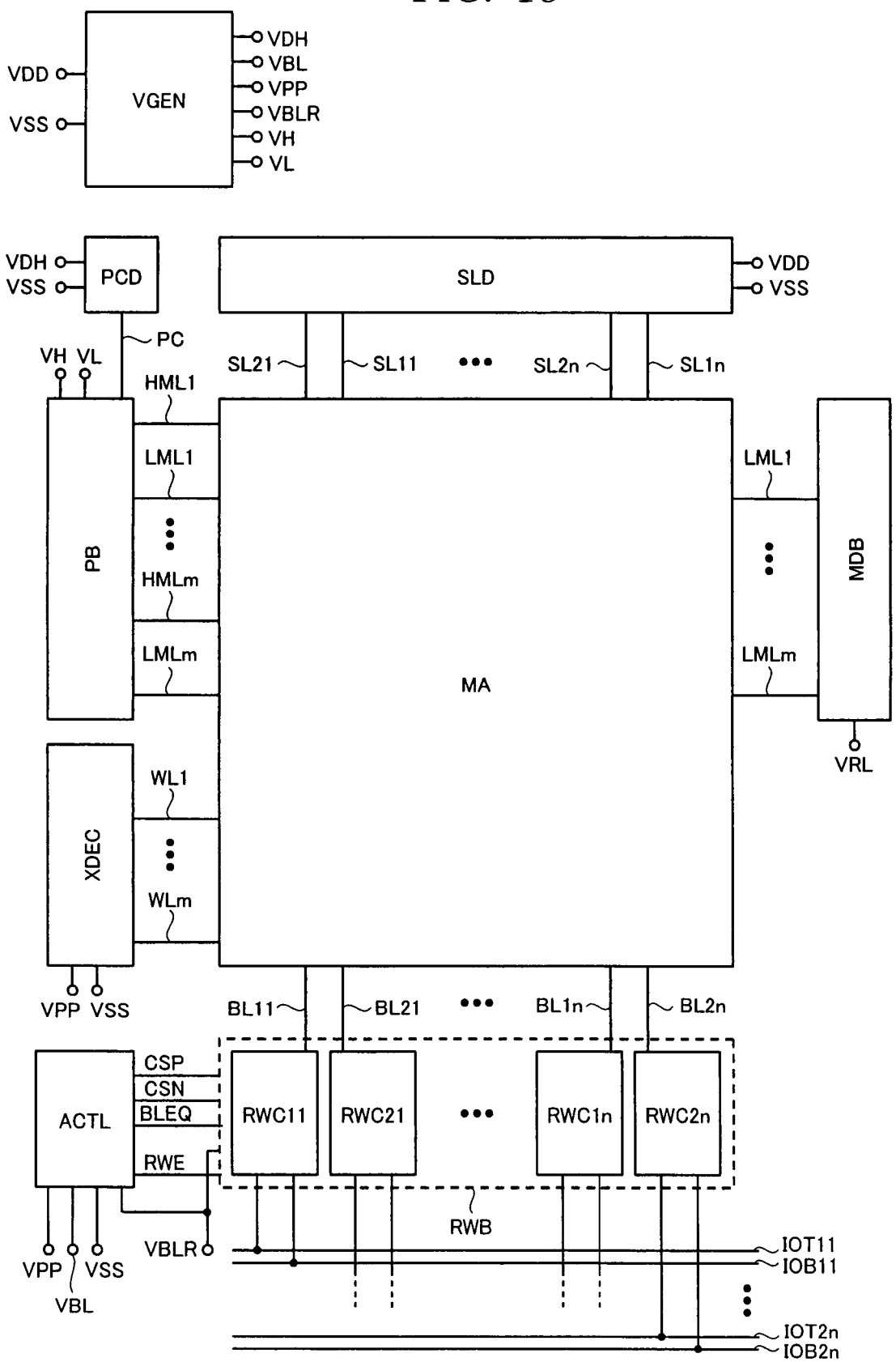
FIG. 18 is a block diagram showing one example of an external power supply supplied to respective circuit blocks in a memory array according to a third embodiment of the present invention.

FIG. 18 shows a block diagram of a memory array in the third embodiment together with the external power supplies to respective sections.

The memory array is obtained by blocking the memory array structure shown in FIG. 13 as one example, and it has a structure that a precharge circuit block PB configured of a plurality of precharge circuits, a match detector block MDB configured of a plurality of match detectors, a row decoder XDEC, a search-line driver SLD, and a read-write circuit block RWB arranged around a memory array MA.

Further, a precharge enable signal driver PCD driving a precharge enable signal PC, an external power supply voltage generator VGEN, and an array controller ACTL are added respectively.

The feature of the third embodiment lies in that a read operation of stored data is performed accurately by using the external power supply voltage generator VGEN to generate a bit line voltage VBL which is higher than the external power supply VDD and which serves as a high voltage level of the search line and driving the voltage of the storage node with a logical value '1' to a voltage higher than the external power supply VDD.

In the following, a memory array structure and a refresh operation will be explained paying attention to this point.

First, the external power supply voltage generator VGEN receives an external power supply VDD inputted from the outside of the chip and the ground potential VSS to output boosted dc voltages VDH, VPP, a bit line voltage VBL, reference voltages VRL, VBLR, and precharge voltages VH, VL, respectively.

The search line driver SLD which is the first circuit block of four circuit blocks used for a search operation receives the external power supply VDD and the ground potential VSS, respectively, to drive the search line pair from the ground potential VSS to the external power supply VDD.

The precharge enable signal driver PCD which is the second circuit block receives the boosted dc voltage VDH and the ground potential VSS to drive the precharge enable signal PC from the ground potential VSS to the boosted dc voltage VDH. Here, the boosted dc voltage VDH is set from the external power supply VDD to a voltage higher than the threshold voltage VTN of the NMOS transistor in the precharge circuit block PB, as described in the first embodiment.

The precharge circuit block PB which is the third circuit block receives the precharge voltages VH, VL to drive the high voltage side match lines HMLr (r=1, 2, . . . , m) to the precharge voltage VH and the low voltage side match lines LMLr (r=1, 2, . . . , m) to the precharge voltage VL according to the precharge enable signal PC, respectively.

The match detector block MDB which is the fourth circuit block receives the reference voltage VRL to discriminate comparison signals generated at the low voltage side match lines LMLr (r=1, 2, . . . , m), respectively. According to such a circuit structure and voltage setting, search operations such as described in FIG. 15 and FIG. 16 are realized.

Next, three circuit blocks used for read-write operation and refresh operation will be explained. The row decoder XDEC which is the first circuit block receives the boosted dc voltage VPP and the ground potential VSS to drive the word lines WLr (r=1, 2, . . . , m) to voltages corresponding to row addresses, respectively. The array controller ACTL which is the second circuit block receives the external power supply VDD, the ground potential VSS, the bit-line voltage VBL, and the reference voltage VBLR, respectively, to drive the common source lines CSP, CSN, the bit-line equalize signal BLEQ, a read-write enable signal RWE according to an input timing of an address.

The read-write circuit block RWB which is the third circuit block receives the common source-lines CSP, CSN, the bit-line equalize signal BLEQ, the read-write enable signal RWE, and the reference voltage VBLR, respectively, to drive the bit line pair to a voltage corresponding to the entry.

Figure 19:
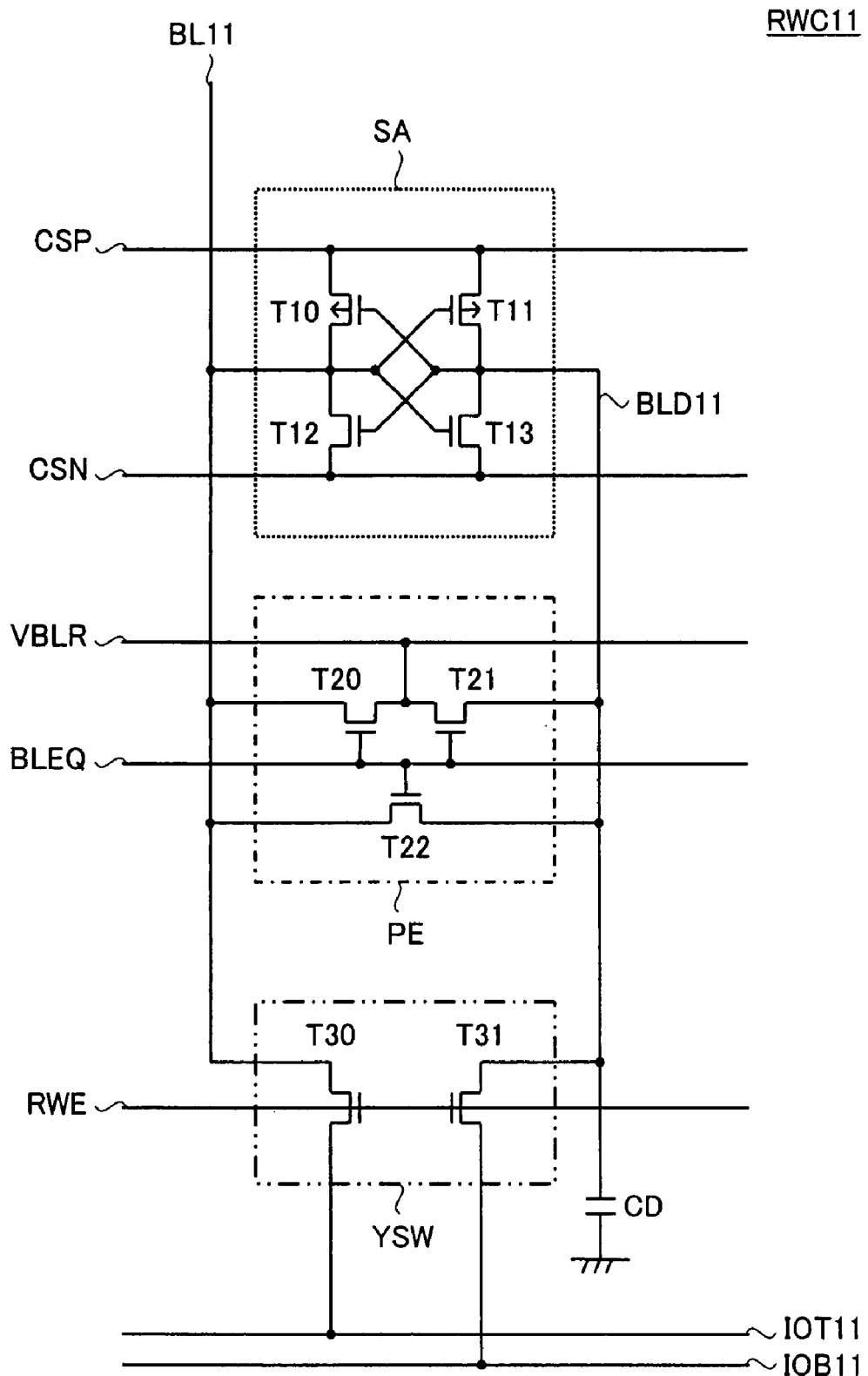
FIG. 19 is a diagram showing a specific constituent example of an elementary circuit in a read-write circuit block shown in FIG. 18.

FIG. 19 shows a read-write circuit RWC11 arranged with the bit line BL11 as a structure example of an element circuit of the read-write circuit block RWB. A sense amplifier SA is a cross-couple-type latch known in the commodity DRAM and configured of two PMOS transistors T10, T11, and two-NMOS transistors T12, T13.

The sources of the transistors T10, T11 are connected to a common source-line CSP, while the sources of the transistors T12, T13 are connected to a common source-line CSN, so that a small voltage difference generated between the bit line BL11 and the dummy bit line BLD11 is discriminated and amplified.

An equalizer PE has a known structure configured of three NMOS transistors T20, T21, T22, and it drives the bit line BL11 and the dummy bit line BLD11 to the reference voltage VBLR according to a bit-line equalize signal BLEQ.

A column switch circuit YSW is configured of NMOS transistors T30, T31, and it connects the bit line BL11 to an input and output line IOT11 and connects the dummy bit line BLD11 to an input and output line IOB11 according to a read-write enable signal RWE.

Incidentally, a dummy capacitance CD is a capacitance which is designed such that load capacitances of the bit line BL11 and the dummy bit line BLD11 become equal to each other in order to accurately discriminate and amplify a small voltage generated at the bit line BL11.

A refresh operation in the memory array thus configured will be explained below with reference to FIG. 20. Here, it is assumed that the memory cell MC11 in the memory array MA shown in FIG. 18 holds the stored data '1' and the logical value of the storage node N1 in the memory cell MC11 in FIG. 13 is '1' like the explanation in FIG. 15 or FIG. 16.

First of all, by driving the bit-line equalize signal BLEQ to the boosted dc voltage VPP to make the transistors in the equalizer PE conductive, the bit line BL11 and the dummy bit line BLD11 are respectively driven to the reference voltage VBLR.

Here, the boosted dc voltage VPP is set to a voltage higher than a threshold voltage VTN1 relative to the bit line voltage VBL such that the source-drain voltages of the transistors T20, T21, T22 are values sufficiently higher than the threshold value VTN1 of these transistors. That is, a relationship of VPP>VBL+VTN1 is satisfied.

Next, by driving the bit line equalize signal BPRE put in the boosted dc voltage VPP to the ground potential VSS to put the equalizer PE in cut off state and drive the word line WL1 put in the ground potential VSS to the boosted dc voltage VPP, the transistor T1 in the memory cell MC11 shown in FIG. 13 is made conductive so that a small voltage is generated at the bit line BL11.

Further, by driving the common source-line CSP put in the reference voltage VBLR to the bit line voltage VBL and driving the common source-line CSN to the ground potential VSS respectively to actuate the sense amplifier SA, a small signal is discriminated and amplified.

Here, an example in which the reference voltage VBLR is set to the intermediate voltage VBL/2 between the bit line voltage VBL and the ground potential VSS and the voltage of the bit line BL11 slightly rises according to the logical value '1' of the storage node N1 in the memory cell MC11 is shown.

Accordingly, the sense amplifier SA discriminates the voltages of the bit line BL11 and the dummy bit line BLD11 to drive the bit line BL11 to the bit line voltage VBL and the dummy bit line BLD11 to the ground potential VSS, respectively.

Simultaneously, a storage node N1 (not shown) is driven to the vicinity of the bit line voltage VBL. Finally, by driving the word line WL put in the boosted dc voltage VPP to the ground potential VSS to change the transistor T1 in the memory cell to a cut off state and then driving the equalize signal BLEQ put in the ground potential VSS to the boosted dc voltage VPP to activate the precharge circuit PE, the bit line BL11 and the dummy bit line BLD11 are respectively driven to the reference voltage VBLR so that the refresh operation is terminated.

From the above structure and operation, the following effects can be obtained in the memory array shown in FIG. 18. That is, by using the voltage generator VGEN to generate a voltage with a level (here, the bit line voltage VBL) higher than the high voltage level (here, the external power supply VDD) of the search line to supply the voltage generated to the read-write circuit block RWB via the array controller ACTL, the bit line can be driven to a voltage higher than the voltage of the search line.

Accordingly, even when the external power supply VDD is made lower, the storage node can be driven to a sufficiently high voltage. In other words, it is made possible that, while maintaining stable read and write operation and refresh operation with a large noise margin, power consumption in search operation can be further reduced.

In the above explanation, the memory array structure and operation generating the bit line voltage VBL higher than the external power supply VDD has been shown. On the contrary, it is possible to set the external power supply VDD as the high voltage level of the bit line and the storage node to generate a voltage lower than the external power supply VDD and utilize it as the high voltage level of the search line. In the TCAM, however, it is required to perform the search operation at high speed, and it is desirable that a stable external power supply VDD inputted externally is set to the high voltage level of the search line in order to drive the search line at high speed. Therefore, the structure shown in FIG. 18 is optimal.

In FIG. 19, the read-write circuit structure where the dummy capacitance CD is connected to the dummy bit line BLD11 has been shown. In FIG. 18, however, such a structure is possible in which the read-write circuit block RWB is shared by two memory arrays. The structure is easily understood from an open bit-line structure widely known in the commodity DRAM. In this case, since the same number of the memory cells with that of the bit lines BL11 can be connected to the dummy bit lines BLD11, even if there is no dummy capacitance CD, load capacitances of the bit lines can be made equal. Therefore, the circuit design is facilitated, and the read operation and the refresh operation can be performed stably.

Further, the structure and operation of the memory array set such that the high voltage level of the bit line has been set to a value higher than the level of the search line have been explained utilizing the structure shown in FIG. 13 as an example, but the voltage setting can be applied to the memory array structure shown in FIG.1 or FIG. 17, where similar effects can be obtained.

In application to the structure shown in FIG. 17, the external power supply voltage generator VGEN generates VRH instead of the reference voltage VRL to supply the same to the match detector block MDB such that the match detector can discriminate the comparison signal voltage generated at the high voltage side match line. In application to the structure shown in FIG. 17, it can be easily understood that the high voltage level of the data line pair can be switched, in accordance with operations, to the external power supply VDD at a time of search operation and to the bit line voltage VBL at a time of the read and write operation and the refresh operation.

Figure 20:
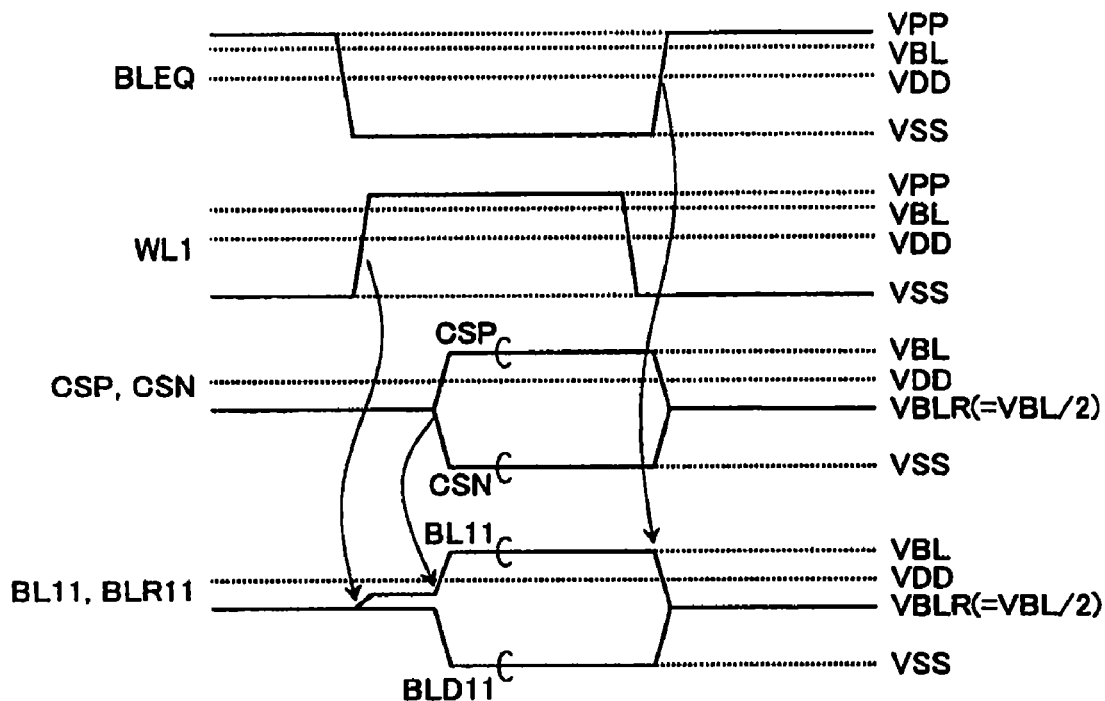
FIG. 20 is a diagram showing one example of a refresh operation timing in the memory array in FIG. 18.

In the above explanation, the refresh operation has been described in FIG. 20. In the read operation or the write operation, however, it is easily understood from the structure and operation of the commodity DRAM to activate the column switch YSW shown in FIG. 19 to connect the bit line BL11 to the input and output line IOT11 and the dummy bit line BLD11 to the input and output line IOB11 respectively and read stored data outside the memory array or write inputted stored data in the memory cell by driving the read-write enable signal RWE put at the ground potential VSS to the external power supply VDD before trailing the activated word line.

The voltage setting according to the third embodiment can be applied to not only the memory array in the above-described first embodiment or second embodiment but also a memory array using the memory cell shown in FIG. 21.

In this case, power consumption in the search operation can be also further reduced by driving the storage node to a sufficiently high voltage to lower the external power supply VDD while allowing stable read and write operation and refresh operation with large noise margin like the structure shown in FIG. 18.

In the above, the TCAMs with various memory array structures have been explained according to the first to third embodiments, but the present invention is not limited to the TCAMs and it can be also applied to a binary content addressable memory used for voice recognition, image recognition, or the like.

The TCAM according to the present invention can be applied to not only an off-chip device, namely, a single device but also a TCAM block mounted on a system LSI so-called "system on chip (SOC)".

Further, the present invention can be applied to not only a memory cell having a storage circuit structured of two transistors and two capacitors but also a memory array configured of memory cells having a storage circuit structured of a known static random access memory (SRAM) structured of six transistors. In both of the cases, effects similar to those described in each embodiment can be obtained.

In the above, the present invention which has been made by the present inventors has been explained specifically based upon the embodiments of the present invention, but it is not limited to the above-described embodiments and it can be modified variously without departing from the gist of the present invention, of course.

INDUSTRIAL APPLICABILITY

As described above, since the semiconductor integrated circuit device according to the present invention generates a comparison signal voltage at the match line pair according to charge-sharing operation to discriminate a comparison signal generated at the low voltage side match line having a smaller parasitic capacitance between the search line and the match line at the match detector, the present invention is suitable for a technique for allowing search operation avoiding influence of search-line noise and performing the search operation at low power and at high speed.

The invention claimed is:

1. A semiconductor integrated circuit device comprising a plurality of the first match lines, a plurality of search line pairs intersecting the plurality of first match lines, a plurality of bit line pairs arranged parallel to the plurality of search line pairs, and a plurality of memory cells arranged at intersecting points of the plurality of first match lines with the plurality of search line pairs, wherein each memory cell has a storage circuit and a comparator circuit, the storage circuit being connected to an associated one of the bit line pairs, and the comparator circuit being connected to an associated one of the search line pairs and an associated one of the first match lines, wherein a voltage supplied to the plurality of bit lines pairs varies between a first voltage and a second voltage lower than the first voltage, wherein a voltage supplied to the plurality of search line pairs varies between a third voltage and a fourth voltage lower than the third voltage, wherein the first voltage is larger than the third voltage, wherein a plurality of second match lines are arranged parallel to the plurality of first match lines, wherein a plurality of match line pairs are formed by associated ones of the plurality of first match lines and associated ones of the plurality of second match lines, each match line pair having respective precharge circuits associated therewith, the precharge circuits driving the associated first match line to the first voltage and driving the associated second match line to the second voltage, and each comparator circuit being arranged between an associated match line pair to compare data held in the associated storage circuit with data inputted via associated search lines of a search line pair, and wherein each second match line is put in a floating state at a time of comparison operation in the associated comparator.

2. The semiconductor integrated circuit device according to claim 1, wherein each of the storage circuits has two transistors and two capacitors.

3. The semiconductor integrated circuit device according to claim 1, wherein the second voltage and the fourth voltage are the same.

* * * * *